US011900859B2

United States Patent
Van Lier et al.

(10) Patent No.: US 11,900,859 B2
(45) Date of Patent: Feb. 13, 2024

(54) ACTIVE MATRIX HYBRID MICROLED DISPLAY

(71) Applicant: Lumileds LLC, San Jose, CA (US)

(72) Inventors: Wilhelmus Johannes Robertus Van Lier, Eindhoven (NL); Marcus Hendrikus Adrianus van Steen, Eindhoven (NL); Nicola Bettina Pfeffer, Eindhoven (NL); Rob Jacques Paul Engelen, Eindhoven (NL); Erkan Diken, Eindhoven (NL); Arjen Gerben Van Der Sijde, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/326,531

(22) Filed: May 21, 2021

(65) Prior Publication Data

US 2022/0375397 A1  Nov. 24, 2022

(51) Int. Cl.
 *G09G 3/32* (2016.01)
 *G09G 3/20* (2006.01)
 *H01L 29/786* (2006.01)

(52) U.S. Cl.
 CPC ............ *G09G 3/32* (2013.01); *G09G 3/2003* (2013.01); *G09G 2300/0452* (2013.01); *G09G 2300/0804* (2013.01); *G09G 2300/0809* (2013.01); *H01L 29/78669* (2013.01)

(58) Field of Classification Search
 CPC ...... G09G 3/32; G09G 3/2003; G09G 3/3233; G09G 3/3241; G09G 3/3258; G09G 2300/0452; G09G 2300/0804; G09G 2300/0809; H01L 29/78669
 See application file for complete search history.

(56) References Cited

U.S. PATENT DOCUMENTS

| 7,800,316 | B2 | 9/2010 | Haug |
| 7,932,875 | B2 | 4/2011 | Dallas et al. |
| 10,089,929 | B2 | 10/2018 | Nathan et al. |
| 10,113,910 | B2 | 10/2018 | Brunk et al. |
| 10,133,944 | B2 | 11/2018 | Zink et al. |

(Continued)

FOREIGN PATENT DOCUMENTS

| EP | 4016516 A1 * | 6/2022 | ............... G09G 3/32 |
| KR | 20200015474 A | 2/2020 | |

(Continued)

OTHER PUBLICATIONS

Martel, et al., "Neural Sensors: Learning Pixel Exposures for HDR Imaging and Video Compressive Sensing With Programmable Sensors" IEEE Transactions on Pattern Analysis and Machine Intelligence, Jul. 1, 2020, vol. 42, Issue 7, 11 pgs.

(Continued)

*Primary Examiner* — Benjamin C Lee
*Assistant Examiner* — Nathan P Brittingham
(74) *Attorney, Agent, or Firm* — Schwegman, Lundberg & Woessner, P.A.

(57) ABSTRACT

A driver system controls a plurality of light emitting diodes (LEDs). The driver system includes a first driver to provide an LED current to each of the plurality of LEDs. The first driver includes a current mirror for the LED current provided to the plurality of LEDs. The driver system also includes a second driver to modulate the LED current provided to the plurality of LEDs.

18 Claims, 14 Drawing Sheets

(56) References Cited

U.S. PATENT DOCUMENTS

| | | | |
|---|---|---|---|
| 2002/0070914 A1* | 6/2002 | Bruning | G09G 3/3413 345/102 |
| 2003/0020826 A1 | 1/2003 | Kehtarnavaz et al. | |
| 2007/0115228 A1* | 5/2007 | Roberts | G09G 3/3413 345/82 |
| 2008/0164948 A1* | 7/2008 | Pelli | G09G 3/20 330/288 |
| 2017/0084671 A1 | 3/2017 | Hack et al. | |
| 2017/0179092 A1 | 6/2017 | Sasaki et al. | |
| 2018/0182294 A1* | 6/2018 | Radhakrishnan | G09G 3/3241 |
| 2018/0247586 A1 | 8/2018 | Vahid Far et al. | |
| 2019/0035819 A1 | 1/2019 | Yamazaki et al. | |
| 2019/0384140 A1 | 12/2019 | Schulten et al. | |
| 2021/0256901 A1* | 8/2021 | Hudson | G09G 3/3426 |
| 2021/0399165 A1* | 12/2021 | Lee | H01L 33/0095 |
| 2022/0201821 A1* | 6/2022 | Verschueren | G09G 3/3241 |

FOREIGN PATENT DOCUMENTS

| | | |
|---|---|---|
| WO | 2019016025 A1 | 1/2019 |
| WO | WO-2022246167 A1 | 11/2022 |

OTHER PUBLICATIONS

"International Application Serial No. PCT/US2022/030207, International Search Report dated Sep. 7, 2022", 7 pgs.
"International Application Serial No. PCT/US2022/030207, Written Opinion dated Sep. 7, 2022", 4 pgs.
U.S. Appl. No. 17/326,494, filed May 21, 2021, System With Adaptive Light Source and Neuromorphic Vision Sensor.

* cited by examiner

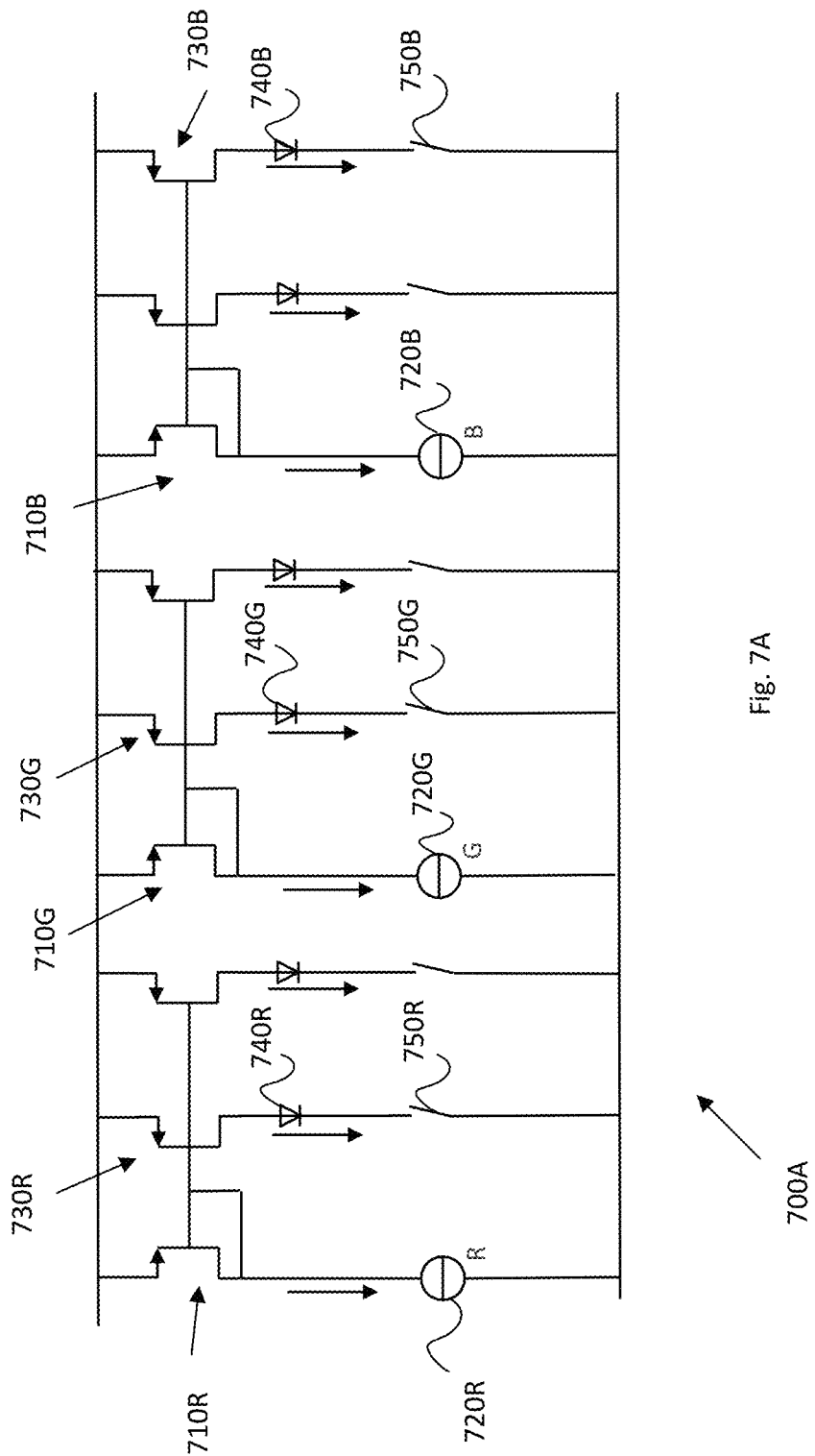

ACTIVE MATRIX HYBRID MICROLED DISPLAY

CROSS-REFERENCE TO RELATED APPLICATIONS

The present application is related to U.S. patent application Ser. No. 17/326,494, filed on May 21, 2021, now issued as U.S. Pat. No. 11,800,233, by inventors Erkan Diken et al. The entire contents of that application are incorporated by reference herein.

BACKGROUND

Technical Field

This disclosure relates to providing a current to an array of light-emitting diodes (LEDs) and, particularly, to providing such a current with thin-film transistors and driving such an array with digital drivers.

Related Art

Some conventional devices include an LED display and an active matrix backplane. The active matrix backplane drives LEDs of the LED display with an analog current.

Other conventional devices include an LED display and digitally-controlled drivers. The drivers modulate the LEDs with, for example, pulse-width modulation (PWM).

BRIEF SUMMARY

Some implementations of the disclosure use both an active matrix backplane for an analog current and drivers for digital modulation.

In one implementation, a driver system for controlling a plurality of light emitting diodes (LEDs) includes a first driver that provides an LED current to each of the plurality of LEDs, the first driver including a current mirror for the LED current provided to the plurality of LEDs; and a second driver that modulates the LED current provided to the plurality of LEDs.

In another implementation, a method implemented by a driver system includes providing an LED current to each of a plurality of light emitting diodes (LEDs) with a first driver, the first driver including a current mirror for the LED current; and modulating, with a second driver, the LED current provided to the plurality of LEDs.

In one more implementation, a light-emitting diode (LED) matrix includes a plurality of LEDs arranged in rows and columns; a first driver that provides an LED current to each of the plurality of LEDs, the first driver including a current mirror for the LED current provided to the plurality of LEDs; and a second driver that modulates the LED current provided to the plurality of LEDs.

BRIEF DESCRIPTION OF THE SEVERAL VIEWS OF THE DRAWINGS

FIG. 7A illustrates a driver system for LEDs of different colors in which an analog current source sets a reference current for each color group of the LEDs.

DETAILED DESCRIPTION

Figure 1:
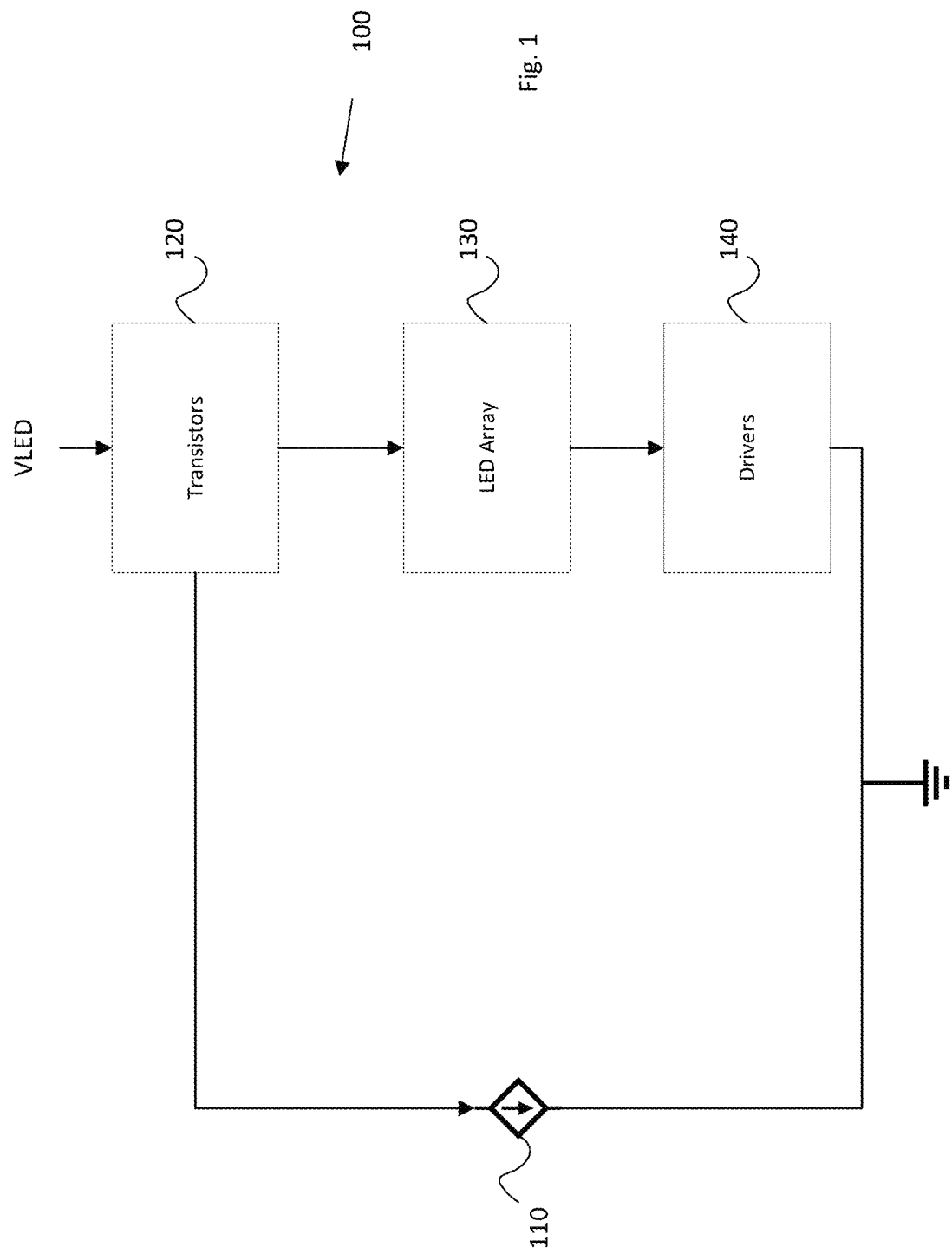
FIG. 1 illustrates a functional system level diagram of an implementation of the present disclosure.

Light emitting pixel arrays support applications that benefit from fine-grained intensity, spatial, and temporal control of light distribution. This control can include, but is not limited to, precise spatial patterning of emitted light from pixel blocks or individual pixels. Depending on the application, emitted light can be spectrally distinct, adaptive over time, and/or environmentally responsive. The light emitting pixel arrays can provide pre-programmed light distribution in various intensity, spatial, or temporal patterns. The emitted light can be based at least in part on received sensor data and can be used for optical wireless communications. Associated electronics and optics can be distinct at a pixel, pixel block, or device level.

Light emitting pixel arrays can be formed from one, two, or three dimensional arrays of LEDs, VCSELS, OLEDs, or other controllable light emitting systems. Light emitting pixel arrays can be formed as pixel arrays on a monolithic substrate, formed by partial or complete segmentation of a substrate, formed using photolithographic, additive, or subtractive processing, or formed through assembly using pick-and-place or other suitable mechanical placement. Light emitting pixel arrays can be uniformly laid out in a grid pattern, or alternatively can be positioned to define geometric structures, curves, random, or irregular layouts.

In one embodiment, light emitting pixel arrays can be an LED pixel array. In some implementations, LED pixel arrays can be microLED (µLED) pixel arrays with hundreds, thousands, or millions of light emitting diodes (LEDs) positioned together on centimeter scale area substrates or smaller. In some implementations, µLEDs can include light emitting diodes sized between 30 microns and 500 microns. In various implementations, the light emitting pixels are positioned less than 1 millimeter apart and are typically spaced apart by distances ranging from 30 microns to 500 microns. The pixels can be embedded in a solid or a flexible substrate, which can be at least in part transparent. For example, the light emitting pixel arrays can be at least partially embedded in glass, ceramic, or polymeric materials.

A controller can be connected to selectively power subgroups of light emitting pixels in the light emitting pixel arrays to provide different light beam patterns. At least some of the light emitting pixels in the light emitting pixel arrays can be individually controlled through connected electrical traces. In other implementations, groups or subgroups of light emitting pixel arrays can be controlled together. In some implementations, the plurality of light emitting diodes can have distinct non-white colors. For example, at least four of the plurality of light emitting diodes can be RGBY groupings of light emitting diodes.

Light emitting pixel array luminaires can include light fixtures that can be programmed to project different lighting patterns based on selective pixel activation and intensity control. Such luminaires can deliver multiple controllable beam patterns from a single lighting device using no moving parts. Typically, delivering such beam patterns is performed by adjusting the brightness of individual LEDs in a 1D or 2D array. Optics, whether shared or individual, can optionally direct the light onto specific target areas. In some implementations, the height of the light emitting diodes, their supporting substrate and electrical traces, and associated micro-optics can be less than 5 millimeters.

Light emitting pixel arrays, including LED or µLED pixel arrays, can be used to selectively and adaptively illuminate buildings or areas for improved visual display or to reduce lighting costs. In addition, light emitting pixel arrays can be used to project media facades for decorative motion or video effects. In conjunction with tracking sensors and/or cameras, selective illumination of areas around pedestrians is possible. Spectrally distinct pixels can be used to adjust the color temperature of lighting, as well as support wavelength specific horticultural illumination.

Street lighting is an application that can greatly benefit from use of light emitting pixel arrays. A single type of light emitting pixel array can mimic various street light types, allowing, for example, switching between a Type I linear street light and a Type IV semicircular street light by appropriate activation or deactivation of selected pixels. In addition, street lighting costs can be lowered by adjusting light beam intensity or distribution according to environmental conditions or time of use. For example, light intensity and area of distribution can be reduced when pedestrians are not present. If pixels of the light emitting pixel array are spectrally distinct, the color temperature of the light can be adjusted according to respective daylight, twilight, or night conditions.

Light emitting pixel arrays are also well-suited for supporting applications involving direct or projected displays. For example, warning, emergency, or informational signs can all be displayed or projected using light emitting pixel arrays. This use of arrays allows, for example, color changing or flashing exit signs to be projected. If a light emitting pixel array is composed of a large number of pixels, textual or numerical information can be presented. Directional arrows or similar indicators can also be provided.

Vehicle headlamps are a light emitting pixel array application that include large pixel numbers and a high data refresh rate. Automotive headlights that actively illuminate selected sections of a roadway can be used to reduce problems associated with glare or dazzling of oncoming drivers. Using infrared cameras as sensors, light emitting pixel arrays activate those pixels that illuminate the roadway, while deactivating pixels that might dazzle pedestrians or drivers of oncoming vehicles. In addition, off-road pedestrians, animals, or signs can be selectively illuminated to improve driver environmental awareness. If pixels of the light emitting pixel array are spectrally distinct, the color temperature of the light can be adjusted according to respective daylight, twilight, or night conditions. Some pixels can be used for optical wireless vehicle to vehicle communication.

Some of the figures described throughout this disclosure have been illustrated with an entirety of a drawing separated between multiple figures to comply with drawing requirements.

FIG. 1 illustrates a functional system level diagram of an implementation of the present disclosure. As illustrated in FIG. 1, an electronic device includes a driver system 100 including a current source 110, transistors 120, an array 130 of LEDs, and digital drivers 140.

The current source 110 is connected to a high rail, such as a power signal. Current source 110 is an analog current source that sets a reference current for one or more of the LEDs of the array 130. Current source 110 can be implemented by discrete components, an analog integrated circuit (IC), or a mixed signal IC, for example. In some implementations, current source 110 is programmable. The output of the current source 110 can be connected to a low rail, such as a ground ring.

The transistors 120 are connected to a high rail and can be included in a transistor backplane. Transistors 120 produce a current based on the reference current set by the current source 110. In one implementation, the transistors 120 are a portion of a current mirror that mirrors the reference current set by the current source 110. The transistors 120 drive the LEDs of array 130 with the mirrored current.

Thus, the transistors 120 can be considered to provide analog driving for the LEDs of array 130.

In one implementation, the transistor backplane is a thin-film backplane, and the transistors 120 are thin-film transistors. The thin-film backplane also connects driver ICs.

The drivers 140 are connected between the array 130 and the low rail. The drivers 140 modulate the current received by the array 130. In one implementation, the drivers 140 provide pulse-width modulation (PWM). Because of the binary operation of this modulation, the drivers 140 can be considered to drive the LEDs of array 130 digitally. In one implementation, the drivers 140 are microdrivers.

Thus, between the analog driving of the current source 110 and the digital driving of the drivers 140, the driver unit 100 can be considered to provide hybrid driving of the LEDs of array 130. Thus, the analog current for multiple pixels can be easily set.

Figure 2:
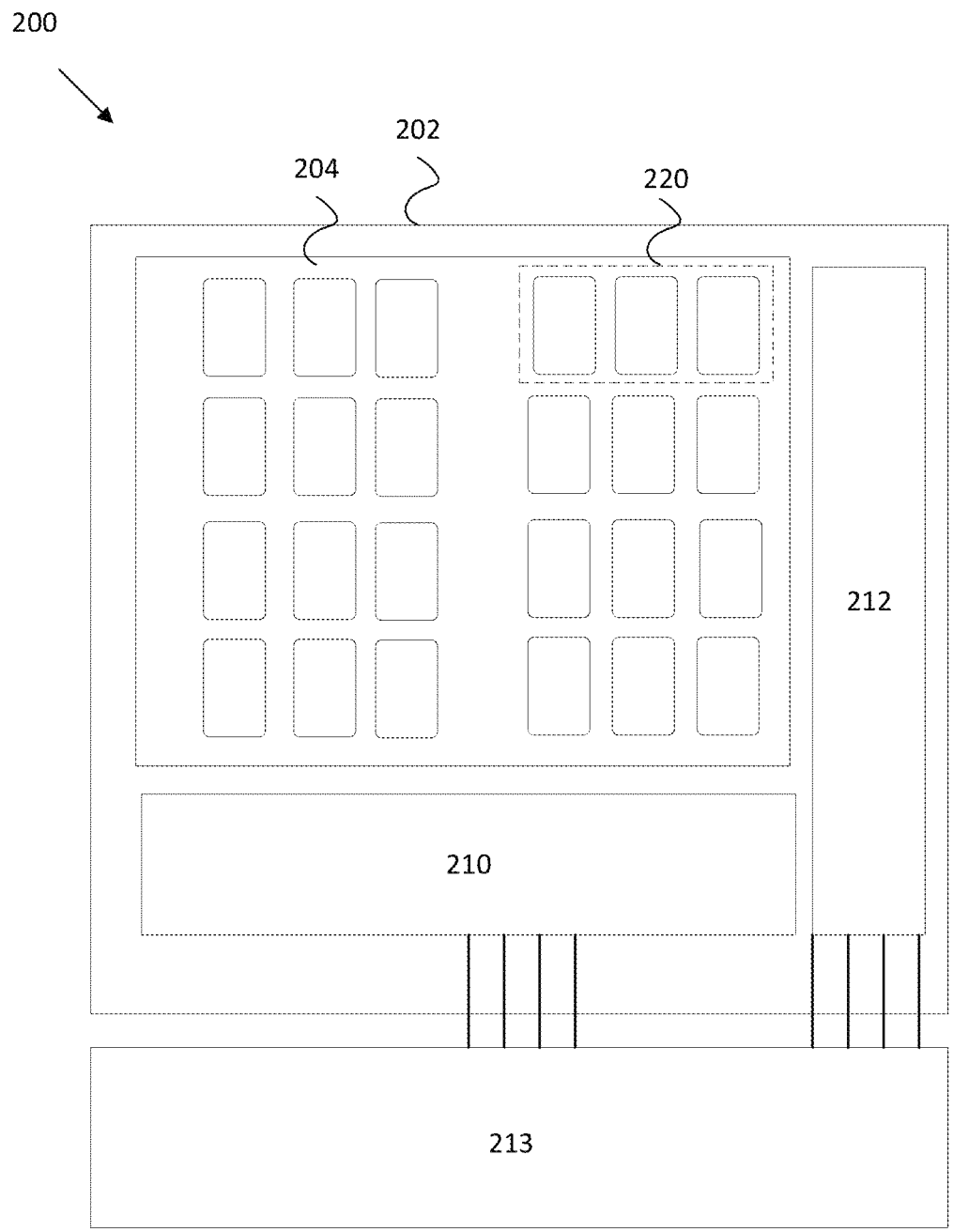
FIG. 2 illustrates an active display panel including an LED array on a thin-film substrate in an implementation of the present disclosure.

FIG. 2 illustrates an active display panel including an LED array on a thin-film substrate in an implementation of the present disclosure. Display panel 200 generally includes a thin film transistor (TFT) substrate 202 supporting a pixel area 204 and a non-pixel area outside of the pixel area 204. The TFT substrate 202 is also referred to as a backplane or transistor backplane. As illustrated, pixel area 204 includes pixels, such as pixel 220, arranged in a matrix. In other implementations, pixel area 204 is arranged in a vector or a matrix of a different size.

Pixel 220 can include a plurality of subpixels that each emit a different color of light. Pixel 220 can also include current source 110, as well as transistors 120.

The subpixels can be formed from micro LED devices. In one such implementation, a micro LED device of a first subpixel is a diode that emits red light, a micro LED device of a second subpixel is a diode that emits green light, and a micro LED device of a third subpixel is a diode that emits blue light. Each micro LED device can be a thin-film transistor.

Thus, the pixel 220 can be considered to emit, for example, white light. Other implementations will readily suggest themselves to the skilled artisan. The subpixels can be arranged in rows, columns, or a matrix.

The pixel 220 also can include TFTs implementing current source 110, transistors 120, and drivers 140. The pixel 220 can include three current controllers, one for each subpixel of a different color. The pixel 220 can also include any number of digital controllers, depending on a number of inputs.

In addition, the pixel area 204 can include capacitors for driving and switching the pixels.

The non-pixel area includes a data driver circuit 210, scan drive circuit 212, a power supply line, and a ground ring. The data driver circuit 210 is connected to a data line of each pixel to enable data signals (e.g., Vdata) to be transmitted to the pixels.

The scan driver circuit 212 is connected to scan (or enable) lines of the pixels and transmits scan signals (e.g., Vscan) to the pixels. The power supply line transmits a power signal (e.g., Vdd) to transistors. The ground ring provides a ground signal (e.g., Vss) to the array of pixels.

The display panel 200 also includes a flexible circuit board 213. The flexible circuit board 213 is connected to the data driver circuit 210, scan driver circuit 212, power supply line, and ground ring. The flexible circuit board 213 includes a power source for supplying the power signal to the power supply line and a power source ground line electrically connected to the ground ring.

Figure 3:
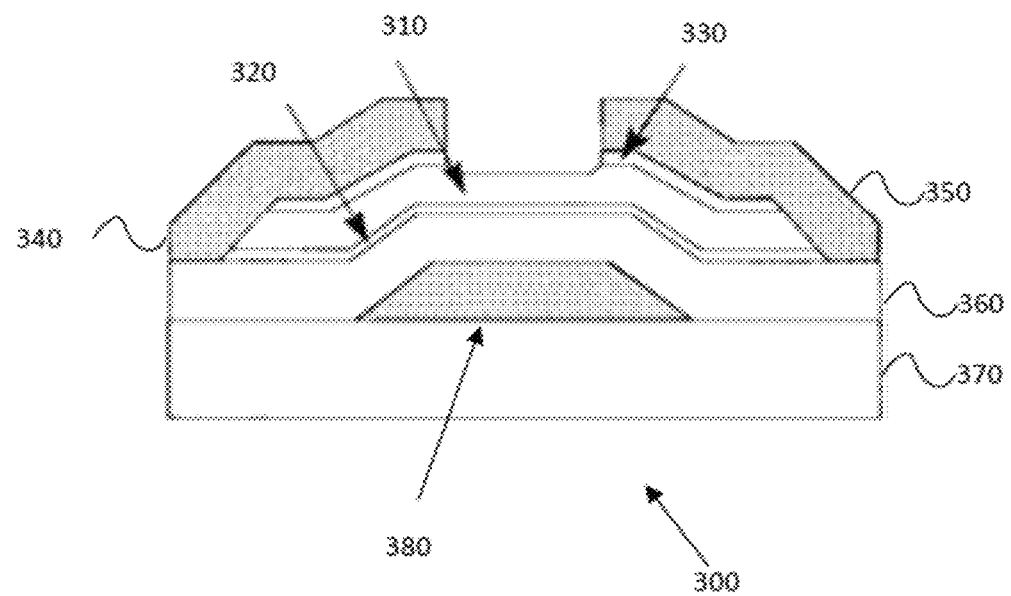
FIG. 3 illustrates a thin-film transistor in an implementation of the present disclosure.

FIG. 3 illustrates a thin-film transistor 300 in an implementation of the present disclosure.

During manufacture, a gate 380 of the thin-film transistor 300 is deposited on glass 370. Next, a silicon nitride (SiNx) layer 360 is deposited on top of the gate 380. A hydrogenated amorphous silicon layer 320 is deposited on top of the silicon nitride layer 360. Subsequently, on top of the hydrogenated amorphous silicon layer 320, a chlorine-incorporated amorphous silicon layer 310 is deposited. Next, a hydrogenated amorphous silicon layer is deposited and doped to form N+ hydrogenated amorphous silicon layer 330.

Portions of hydrogenated amorphous silicon layer 320, chlorine-incorporated amorphous silicon layer 310, and N+ hydrogenated amorphous silicon layer 330 are removed. Source 340 and drain 350 are then deposited to contact silicon nitride layer 360.

In the example of FIG. 3, an amorphous silicon bottom gate thin-film transistor is formed. Other thin-film transistors can be used for transistors 120 instead. For example, transistors 120 can be or can include indium gallium zinc oxide (IGZO) thin-film transistors. Thus, hydrogenated amorphous silicon layer 320 instead can be an amorphous IGZO material. These IGZO transistors can be dual gate to improve mobility. Transistors 120 can also be or include low-temperature polycrystalline silicon (LTPS) transistors. Thus, hydrogenated amorphous silicon layer 320 instead can be an LTPS material.

Figure 4:
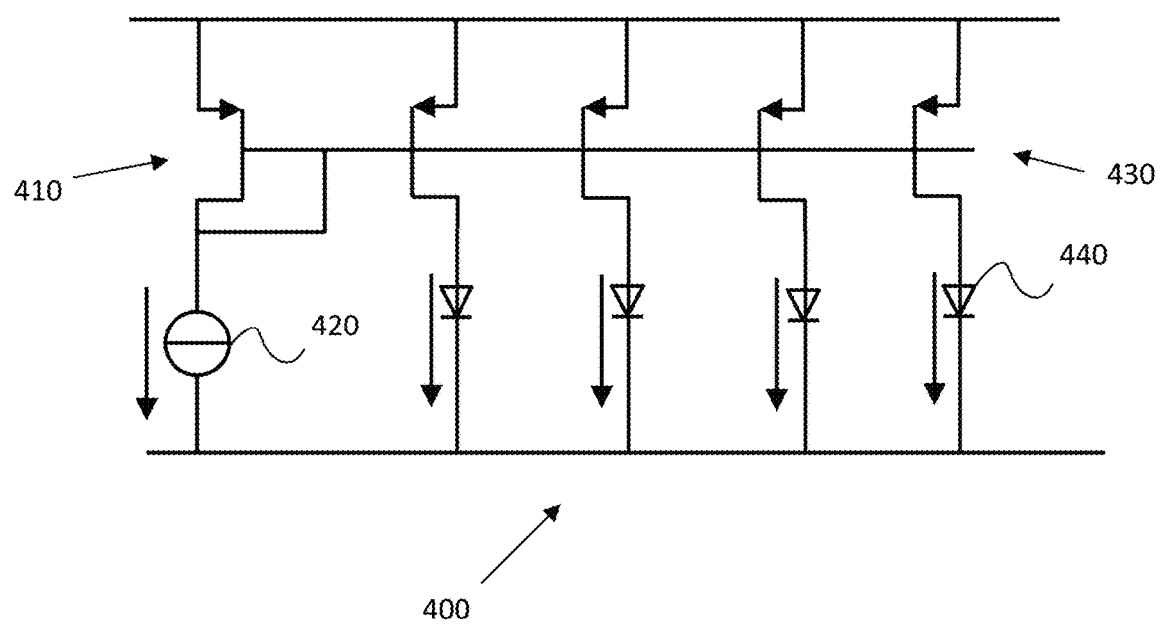
FIG. 4 illustrates a driver system in an implementation of the present disclosure.

FIG. 4 illustrates a driver system 400 in an implementation of the present disclosure. The driver system 400 includes a mirror transistor 410, a current source 420, driving transistors 430, and LEDs 440. The driving unit 400 also includes a backplane (not pictured).

As illustrated in FIG. 4, mirror transistor 410 is a PMOS transistor including a first terminal connected to the power signal, such as Vdd. A gate of mirror transistor 410 is connected to a second terminal of the mirror transistor 410. In the implementation of FIG. 4, the first terminal of mirror transistor 410 is a source, and the second terminal of mirror transistor 410 is a drain. Thus, mirror transistor 410 is a diode-connected transistor. The mirror transistor 410 can be a thin-film transistor implemented in the transistor backplane.

Mirror transistor 410 is not limited to such an implementation. For example, mirror transistor 410 can be implemented as an NMOS transistor. Additional modifications are known to those of ordinary skill in the art.

Current source 420 sets a reference current to flow through mirror transistor 410. In many implementations, current source 420 is a variable current source. Current source 420 can be a fixed current source in some implementations. In the implementation of FIG. 4, current source 420 is a discrete component, such as a resistor, diode, or other transistor. Mirror transistor 410 and current source 420 are an implementation of current source 110.

A gate of a driving transistor 430 is connected to a gate of mirror transistor 410. A first terminal of the driving transistor 430 is connected to the power signal, Vdd. A second terminal of the driving transistor 430 is connected to an input of an LED 440. In the implementation illustrated in FIG. 4, driving transistor 430 is a PMOS transistor. Thus, the first terminal of driving transistor 430 is a source, and the second terminal of driving transistor 430 is a drain.

Thus, driving transistor 430 forms a current mirror with mirror transistor 410. As such, the reference current set by the current source 420 also flows through driving transistor 430.

The driving transistor 430 can be one of transistors 120. The driving transistor 430 is, for example, a thin-film transistor implemented on the backplane.

The driving unit 400 can include multiple driving transistors 430 arranged similarly to the aforementioned driving transistor 430. Thus, the driving transistors 430 generally are the same type, e.g., PMOS. The same first terminals (e.g., sources) of the driving transistors 430 are connected to the power signal. Similarly, the same second terminals (e.g., drains) of the driving transistors 430 are connected to the LEDs 440. The gates of the driving transistors 430 are connected to each other.

An LED 440 includes a first terminal connected to the second terminal of the driving transistor 430. Thus, the LED 440 receives the reference current driven by the driving transistor 430. Upon receiving an electric signal, the LED 440 emits light. A second terminal of the LED 440 can be connected to a low rail, such as the ground ring.

Thus, the LED 440 can be implemented in the array 130 or be one of the subpixels of pixel 220.

Figure 5A:
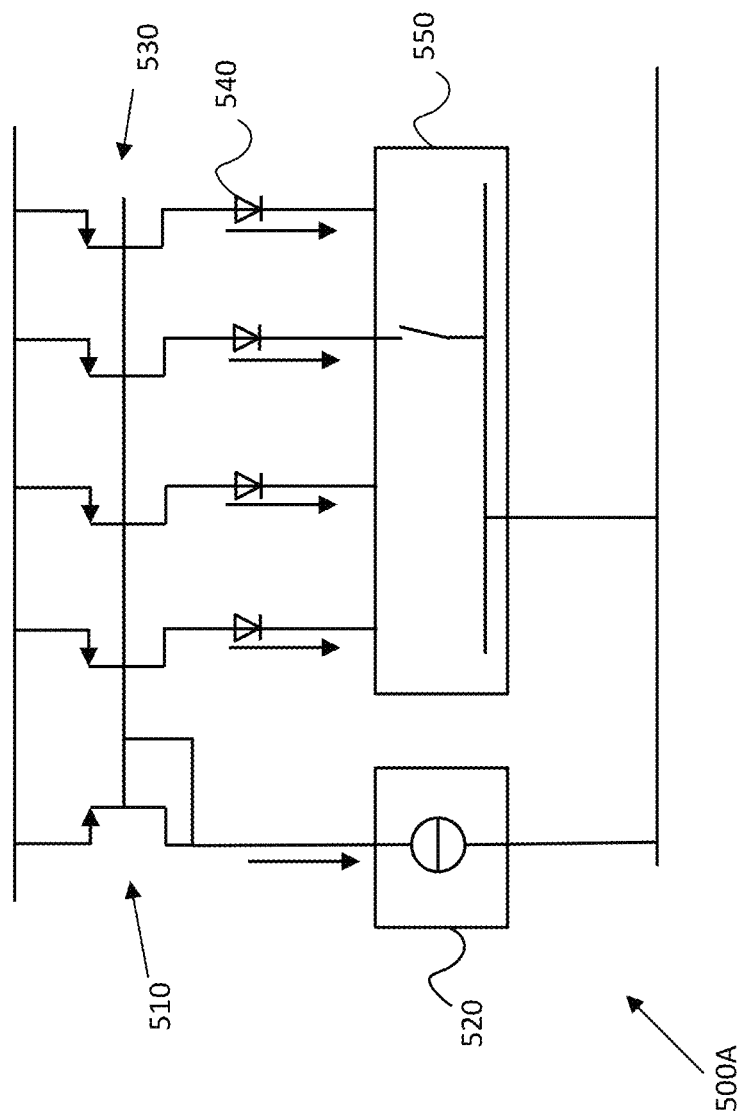
FIG. 5A illustrates a driver system in which an analog IC sets a reference current for a digital driver IC that modulates a current for a plurality of LEDs.

FIG. 5A illustrates a driver system 500A in which an analog IC 520 sets a reference current for a digital driver IC 550 that modulates a current for a plurality of LEDs 540. Driver system 500A includes a mirror transistor 510, analog IC 520, driving transistors 530, LEDs 540, and digital driver IC 550. Mirror transistor 510, driving transistors 530, and LEDs 540 are structurally similar to mirror transistor 410, driving transistors 430, and LEDs 440. Thus, further description about mirror transistor 510, driving transistors 530, and LEDs 540 is omitted.

Driver system 500A differs from driver system 400 of FIG. 4 in that driver system 500A does not necessarily include a discrete component as current source 420. Thus, driver system 500A includes the analog IC 520 and digital driver IC 550.

The second terminal of mirror transistor 510 connects to a pin or other input of the analog IC 520. Similar to current source 420, analog IC 520 sets a current to flow through mirror transistor 510. In many implementations, analog IC 520 includes a variable current source. Analog IC 520 can be a fixed current source in some implementations. Because driving transistor 530 forms a current mirror with mirror transistor 510, the reference current set by the analog IC 520 also flows through driving transistor 530 to LEDs 540.

A pin or other output of analog IC 520 connects to a low rail, such as the ground ring.

The second terminals of LEDs 540 are connected to pins or other inputs of the digital driver IC 550.

Digital driver IC 550 includes modulators that modulate the signal (e.g., current) passing through the LEDs 540. For example, the modulators of digital driver IC 550 can perform pulse-width modulation (PWM) on the signal. Accordingly, digital driver IC 550 can include or otherwise implement pulse-width modulators. In one implementation, the modulators are implemented using switches.

The signal from each of the LEDs 540 passes through a respective pulse-width modulator of digital driver IC 550. When a respective pulse-width modulator is off (e.g., the switch is open), current does not pass through the respective LED 540. Thus, when the respective pulse-width modulator is off, the respective LED 540 does not emit light.

When the respective pulse-width modulator is on (e.g., the switch is closed), current passes through the respective LED 540. Thus, when the respective pulse-width modulator is on, the respective LED 540 emits light.

Thus, the driving transistors 530 drive the LEDs 540 with an analog signal, such as a current. Meanwhile, the digital driver IC 550 drives the LEDs 540 with a digital signal, such as a pulse-width modulated signal. Due to this combination of analog driving and digital driving, the LEDs 540 can be considered to be hybrid driven.

Pins or other outputs of digital driver IC 550 are connected to a low rail, such as the ground ring.

Thus, in FIG. 5A, no mixed signal IC design is required.

As shown in FIG. 5A, digital driver IC 550 has one output. In this case, a higher number of multiple LEDs are driven by a single microdriver. A lower number of microdrivers for a given number of LEDs can result in lower cost and higher yield.

Also, because the number of analog and digital drivers can be optimized independently, designers have increased flexibility.

Figure 5B:
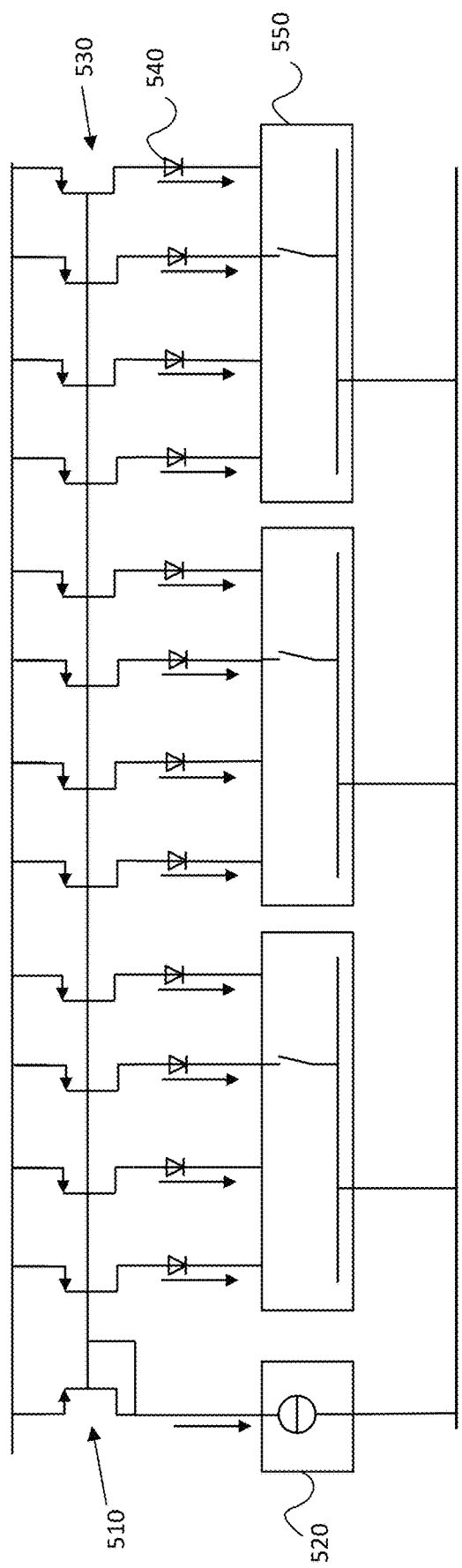
FIG. 5B illustrates a driver system in which an analog IC sets a reference current for a plurality of digital driver ICs that modulate currents for a plurality of LEDs.

FIG. 5B illustrates a driver system 500B in which an analog IC 520 sets a reference current for a plurality of digital driver ICs 550 that modulate currents for a plurality of LEDs 540. Driver system 500B differs from driver system 500A in that analog IC 520 sets a reference current for a plurality of digital driver ICs 550, each of the digital driver ICs modulating a plurality of LEDs 540.

Conventionally, an IC drives 12 subpixels, for a total of three or four pixels, depending on whether the pixels are defined by three colors (e.g., red, green, blue) or four colors (e.g., red, green, blue, and cyan or white). Driver system 500B is enhanced in that analog IC 520 can control the current for any number of digital driver ICs 550. Indeed, the number of pixels controlled by analog IC 520 is based on the uniformity of the backplane.

FIGS. 5A and 5B are intended to be illustrative of a pixel, not limiting, and the inputs of digital driver IC 550 need not be on the same side of digital driver IC 550. Similarly, the inputs of digital driver IC 550 to which the second terminals of LEDs 540 are connected can be located on any side of digital driver IC 550, as is known in the art. Inputs and outputs of analog IC 520 need not be opposite.

Figure 6:
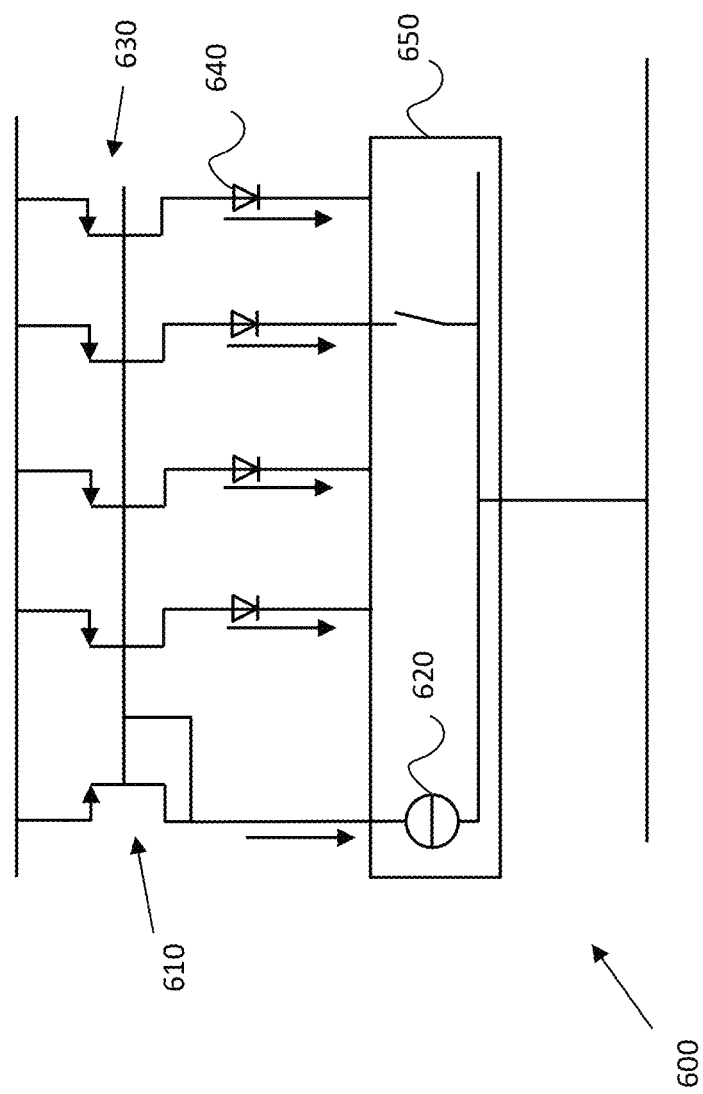
FIG. 6 illustrates a driver system in which a current source is implemented with a mixed signal IC, and the mixed signal IC modulates a current for a plurality of LEDs.

FIG. 6 illustrates an implementation of a driver system 600 in which a current source 620 is implemented with a mixed signal IC 650, and the mixed signal IC 650 modulates a current for a plurality of LEDs 640. Driver system 600 includes a mirror transistor 610, a current source 620, driving transistors 630, LEDs 640, and the mixed signal IC 650. Mirror transistor 610, driving transistors 630, and LEDs 640 are structurally similar to mirror transistor 410, driving transistors 430, and LEDs 440. Thus, further description of mirror transistor 610, driving transistors 630, and LEDs 640 is omitted.

Driver system 600 of FIG. 6 differs from driver system 500A of FIG. 5 in that, in FIG. 5, the analog IC 520 sets the current and the digital driver IC 550 modulates the current passing through the LEDs 540. In the implementation illustrated in FIG. 6, the driver system 600 includes a mixed signal IC 650 that includes an analog current source 620. In addition, the mixed signal IC 650 includes modulators that can modulate the signal (e.g., current) passing through the LEDs 640. For example, the modulators of mixed signal IC 650 can perform pulse-width modulation (PWM) on the signal.

Thus, the second terminal of driving transistor 610 is connected to a first pin or other input of mixed signal IC 650. As with FIG. 5, FIG. 6 is illustrative, not limiting, of a chip layout. Thus, in this context, the phrase "first pin" simply serves to identify one of the pins and is not intended to be limited to pin 1 of a mixed signal IC 650 (e.g., the pin nearest a notch or dot, proceeding in a counterclockwise manner).

The first pin of mixed signal IC 650 is connected within mixed signal IC 650 to an input of analog current source 620. Analog current source 620 sets a current for driving transistor 630. An output of analog current source 620 is connected within mixed signal IC 650 to a second pin (again, not necessarily pin 2) of mixed signal IC 650. The second pin of mixed signal IC 650 is connected to a low rail, such as the ground ring.

The second terminals of LEDs 640 are connected to pins or other inputs of mixed signal IC 650. Needless to say, the inputs of mixed signal IC 650 need not be on the same side of mixed signal IC 650. Similarly, the inputs to which the second terminals of LEDs 640 are connected need not be on the same side of mixed signal IC 650 as the first pin to which the second terminal of driving transistor 610 is connected. The inputs of mixed signal IC 650 to which the second terminals of LEDs 640 are connected can be designated flexibly on mixed signal IC 650, as is known in the art.

The pins or other inputs of mixed signal IC 650 to which the second terminals of LEDs 640 are connected are connected within the mixed signal IC 650 to modulators. The modulators are, for example, pulse-width modulators. The pulse-width modulators are structurally similar to the pulse-width modulators of digital driver IC 550. Therefore, further discussion of the pulse-width modulators is omitted.

The outputs of the pulse-width modulators are connected to a third pin or other output of mixed signal IC 650. Of course, other implementations are possible, and the mixed signal IC 650 can have one or more additional outputs to which the outputs of the pulse-width modulators are connected.

In FIG. 6, mixed signal IC 650 drives four LEDs. In other implementations, a different number of LEDs can be driven, such as 32 LEDs. In a higher resolution application, such as a smartphone, the number of pixels per mixed signal IC often will be higher. Also, there can be a single microdriver, as in FIG. 5.

Driving transistors physically close to each other will have similar characteristics and, thus, similar performance. Manufacturing imperfections will cause larger variations in characteristics across the plate. Thus, the number of pixels per driver IC depends on the uniformity of the TFT array.

FIG. 7A illustrates a driver system 700A for LEDs of different colors in which a separate current source sets a reference current for each color group of the LEDs.

Similar to the previous discussion with regard to FIG. 2, the plurality of LEDs can include a red LED 740R, a green LED 740G, and a blue LED 740B. Red LED 740R, green LED 740G, and blue LED 740B can have different characteristics. Accordingly, certain applications provide different reference currents to red LED 740R, green LED 740G, and blue LED 740B.

Thus, FIG. 7A includes independent current sources 720R, 720G, and 720B. In one implementation, current sources 720R, 720G, and 720B are discrete components.

Each of current sources 720R, 720G, and 720B sets a reference current for a mirror transistor. Thus, current source 720R sets a reference current for mirror transistor 710R, analog source 720G sets a reference current for mirror transistor 710G, and analog source 720B sets a reference current for mirror transistor 720B. Each of these reference currents can be the same, although these currents are different in many implementations.

Each of mirror transistors 710R, 710G, and 710B is structurally similar to mirror transistor 510. Thus, further discussion of mirror transistors 710R, 710G, and 710B is omitted.

Further, each of driving transistor 730R, 730G, and 730B is structurally similar to driving transistor 530. Thus, further discussion of each of driving transistors 730R, 730G, and 730B is omitted.

LED 740R, 740G, and 740B differ from each other in that they emit different color light. In particular, LED 740R emits red light, LED 740G emits green light, and LED 740B emits blue light. Otherwise, each of LED 740R, 740G, and 740B is structurally similar to LED 540. Thus, further discussion of LED 740R, 740G, and 740B is omitted.

To avoid complicating FIG. 7A, one driving transistor 730R, one driving transistor 730G, and one driving transistor 730B are labelled. Further, in FIG. 7A, two transistors 730R are connected to a gate of mirror transistor 710R, two transistors 730G are connected to a gate of mirror transistor 710G, and two transistors 730B are connected to a gate of mirror transistor 710B. Of course, additional driving transistors 730R, 730G, and 730B can be so connected. In addition, the number of driving transistors 730R can be different from the number of driving transistors 730G or the number of driving transistors 730B, and the number of driving transistors 730G can be different from the number of driving transistors 730B.

Driver system 700A also includes modulators that can modulate the signal (e.g., current) passing through the LEDs 740R, 740G, 740B. The modulators are, for example, pulse-width modulators. The pulse-width modulators are structurally similar to the pulse-width modulators of digital driver IC 550. Therefore, further discussion of the modulators is omitted.

LED 740R, 740G, and 740B form a pixel in some implementations. In other implementations, LED 740R, 740G, and 740 are addressed individually as pixels themselves.

Figure 7B:
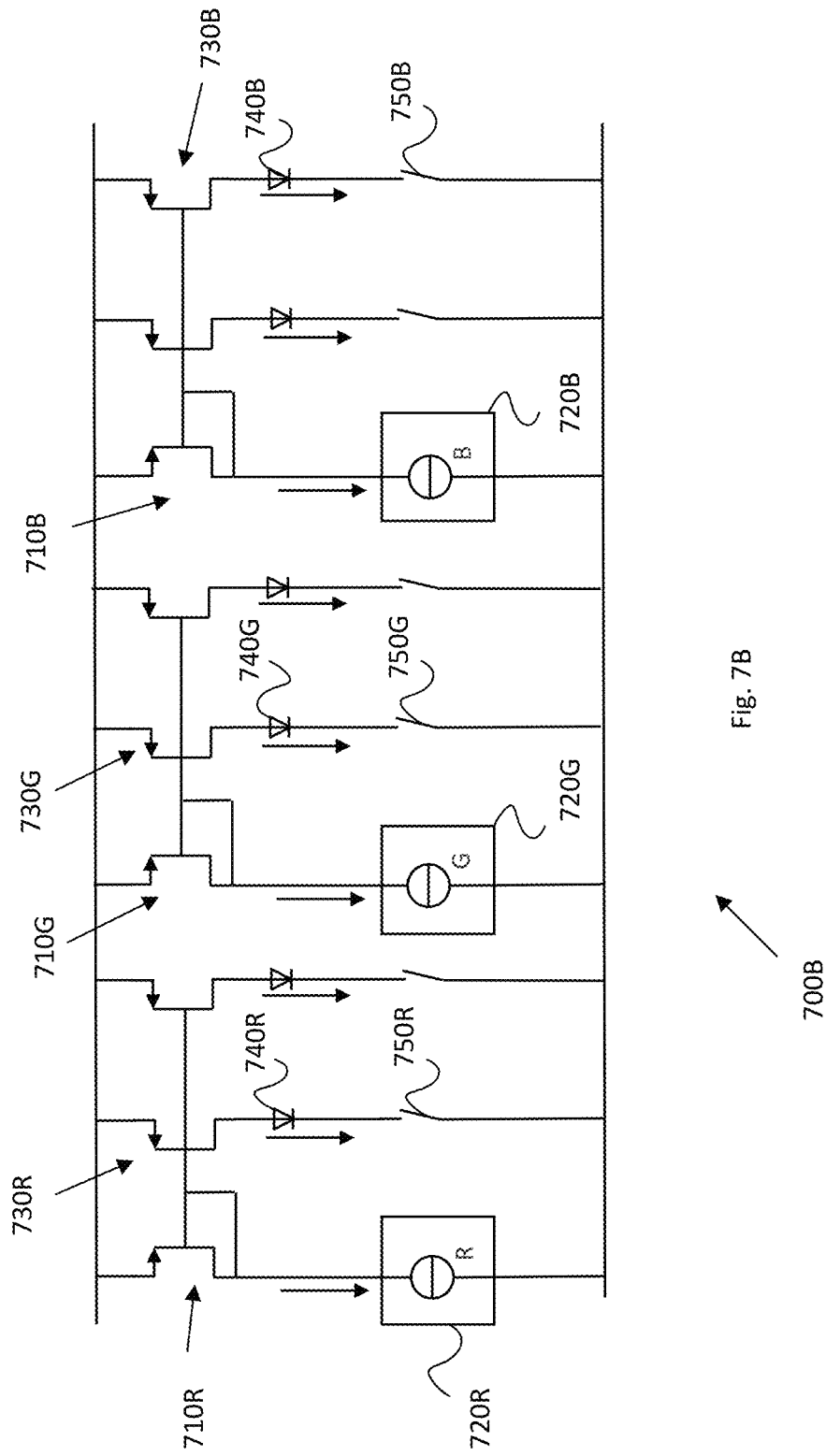
FIG. 7B illustrates a driver system for LEDs of different colors in which as separate analog IC current source sets a reference current for each color group of the LEDs.

FIG. 7B illustrates a driver system 700B for LEDs of different colors in which a separate analog IC sets the reference current for each color group of the LEDs.

That is, FIG. 7B differs from FIG. 7A in that, in FIG. 7A, analog sources 720R, 720G, and 720B are separate elements, such as discrete components. In contrast, FIG. 7B illustrates analog sources 720R, 720G, and 720B as included in separate analog ICs.

Thus, the second terminal of mirror transistors 710R, 710G, and 710B connect to a pin or other input of an analog IC. This pin or other input of the analog IC is routed within the analog IC to a respective analog source 720R, 720G, or 720B.

Analog sources 720R, 820G, and 720B set a reference current. An output of the respective analog source 720R, 720G, or 720B is routed within the respective analog IC to a pin or other output of the analog IC. This pin or other output of the analog IC is then routed to a low rail, such as the ground ring.

In driving system 700B, analog sources 720R, 720G, and 720B are illustrated as included in three separate analog ICs. In some implementations, these analog ICs can be combined in fewer analog ICs, such as in one analog IC.

Thus, in driving systems 700A, 700B, no mixed signal IC design is required.

Figure 8:
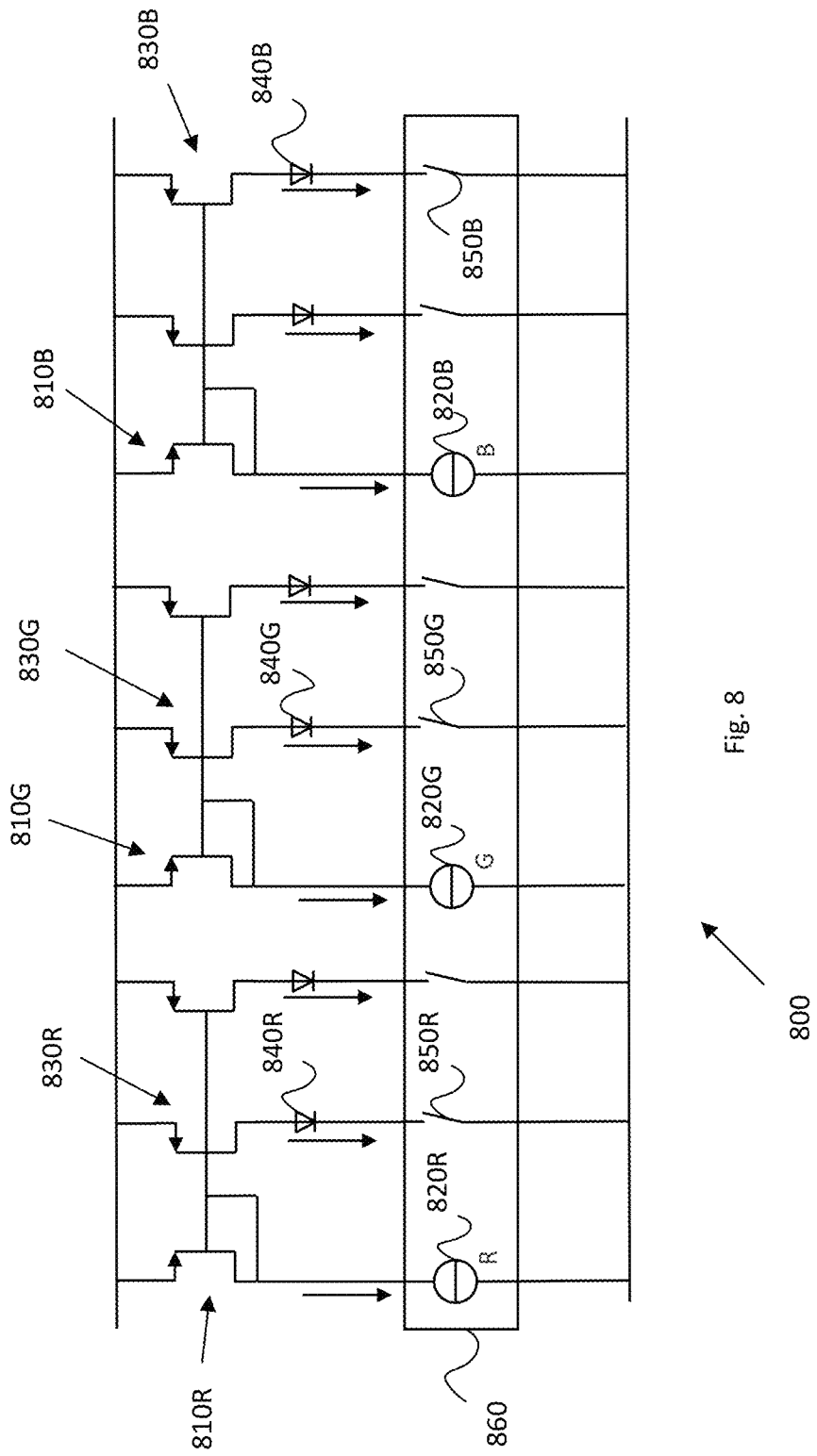
FIG. 8 illustrates a driver system for LEDs of different colors in which a mixed signal IC both sets a reference current for each color group of the LEDs and modulates the currents for the individual LEDs in said groups.

FIG. 8 illustrates a driver system 800 for LEDs of different colors in which a mixed signal IC 860 both sets a reference current for each color group of the LEDs 840R, 840G, 840B and modulates the currents for the individual LEDs in said groups.

FIG. 8 is generally similar to FIG. 7A and FIG. 7B. FIG. 8 differs from FIG. 7B in that analog sources 820R, 820B, and 820G are not included in separate analog ICs. In the implementation of FIG. 8, analog sources 820R, 820B, and 820G are included in a single mixed signal IC 860. In addition, modulators 850R, 850G, and 850B are also included in mixed signal IC 860.

Mirror transistors 810R, 810G, and 810B are structurally similar to mirror transistors 710R, 710G, and 710B. Thus, further description of mirror transistors 810R, 810G, and 810B is omitted.

The second terminals of mirror transistors 810R, 810G, and 810B are connected to pins or other inputs of mixed signal IC 860. These pins or other inputs are connected internally to the analog sources 820R, 820G, and 820B. Analog sources 820R, 820G, and 820B set reference currents. Analog sources 820R, 820G, and 820B can set the reference currents to be the same as each other or different. Outputs of analog sources 820R, 820G, and 820B are connected internally to one or more pins or other outputs of mixed signal IC 860.

Similarly, driving transistors 830R, 830G, and 830B are similar to driving transistors 730R, 730G, and 730B. Thus, further description of driving transistors 830R, 830G, and 830B is omitted.

LEDs 840R, 840G, and 840B are structurally similar to LEDs 740R, 740G, and 740B. The second terminals of LEDs 840R, 840G, and 840B are connected to pins or other inputs of mixed signal IC 860. These pins or other inputs are connected internally to inputs of modulators 850R, 850G, and 850B.

Modulators 850R, 850G, and 850B are structurally similar to modulators 750R, 750G, and 750B. Thus, modulators 850R, 850G, and 850B can be pulse-width modulators. Further description of modulators 850R, 850G, and 850B is omitted.

Outputs of modulators 850R, 850G, and 850B are connected to at least one pin or other output of mixed signal IC 860. As illustrated, mixed signal IC 860 has multiple outputs. In another implementation, mixed signal IC 860 has a single output. Such an implementation can reduce routing concerns of designers.

In the implementation of FIG. 8, the driver system 800 includes a single mixed signal IC 860. Driver system 800 is not limited to a single mixed signal IC 860. In some implementations, the driver system 800 includes multiple mixed signal ICs 860, such as one mixed signal IC 860 per color group of LEDs 840R, 840G, and 840B.

Figure 9:
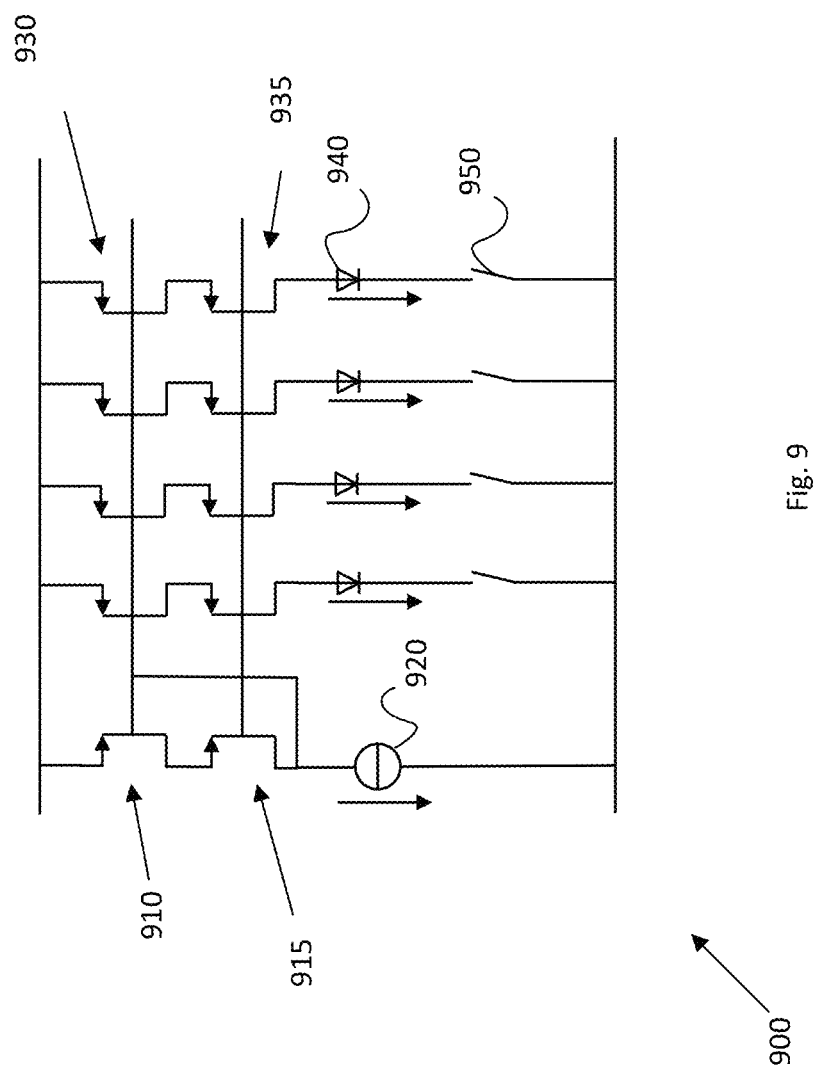
FIG. 9 illustrates a driver system including stacked transistors in an implementation.

FIG. 9 illustrates a driver system 900 including stacked transistors. Driver system 900 is similar to driver system 500A. In the implementation of FIG. 9, driver system 900 illustrates modulators 950 absent an IC. In addition, driver system 900 includes two mirror transistors 910 and 915. A first terminal of mirror transistor 910 is connected to a high rail, such as the power signal. A second terminal of mirror transistor 910 is connected to a first terminal of mirror transistor 915. A gate of mirror transistor 910 is connected at a node to a second terminal of mirror transistor 915.

A gate of mirror transistor 915 is connected to the node. An input of analog source 920 is also connected to the node.

Analog source 920 sets a reference current. Analog source 920 is similar to analog source 520. Thus, further explanation of analog source 920 is omitted. An output of analog source 920 is connected to a low rail, such as the ground ring.

A first terminal of driving transistor 930 is connected to a high rail, such as the power signal. A second terminal of driving transistor 930 is connected to a first terminal of driving transistor 935. The gate of driving transistor 930 is connected to the node. The gate of driving transistor 935 is also connected to the node.

The second terminal of driving transistor 935 is connected to an input of LED device 940.

The LED device 940 emits light. The LED device 940 is structurally similar to the LED device 540. Thus, further description of LED device 940 is omitted. The output of LED device 940 is connected to an input of modulator 950.

Modulator 950 is, for example, a pulse-width modulator. Modulator 950 is structurally similar to modulator 550. Thus, further description of modulator 950 is omitted.

In the illustration of driver system 900, the first terminals of mirror transistors 910, 915 are sources, and the second terminals of mirror transistors 910, 915 are drains. Similarly, the first terminals of driving transistors 930, 935 are sources, and the second terminals of driving transistors 930, 935 are drains. Thus, in the illustration of driver system 900, the mirror transistors 910, 915 and the driving transistors 930, 935 are all PMOS transistors. In other implementations, the mirror transistors 910, 915 and the driving transistors 930, 935 are NMOS transistors with accompanying modifications.

In driver system 900, analog source 920 is illustrated as a discrete component. In other implementations, analog source 920 is included within an analog IC or a mixed signal IC, as discussed with reference to FIGS. 5, 6, 7B, and 8, for example. In addition, driver system 900 can include multiple analog sources 920, such as for, but not limited to, implementations in which different currents are set for different colors of LEDs (as discussed with regard to FIG. 8).

By using two mirror transistors and two driving transistors in the current mirror, the driver system will be more stable for changing the forward voltage (Vf).

Figure 10:
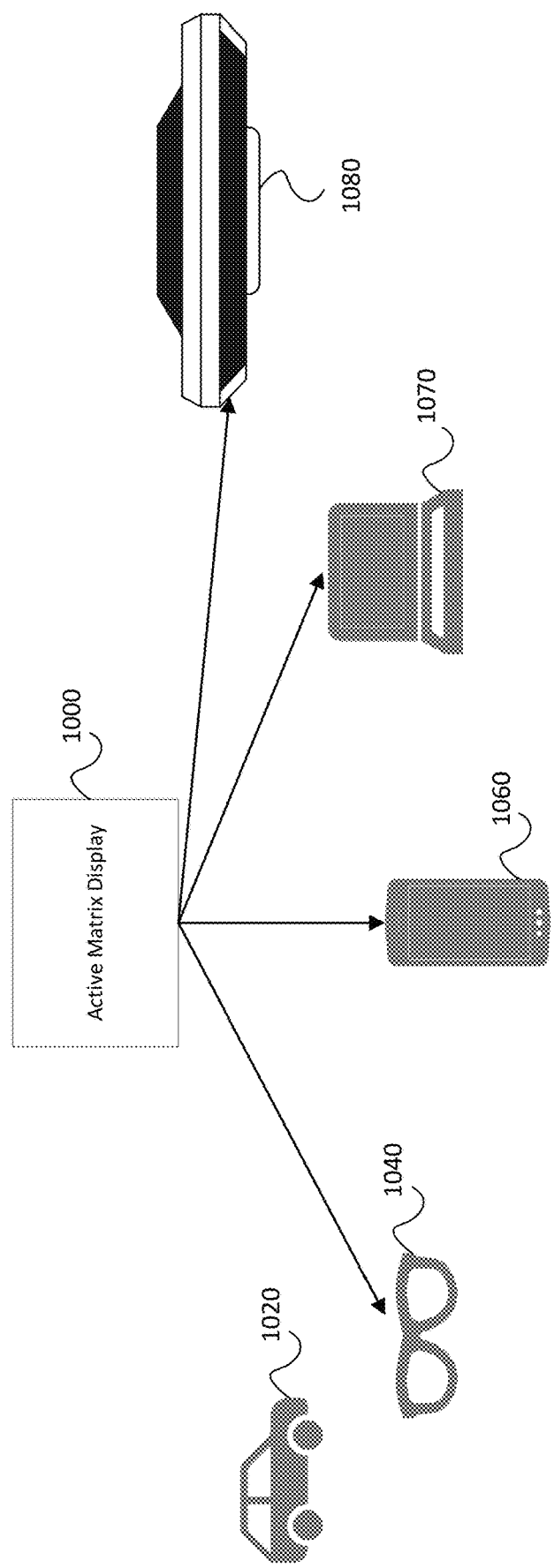
FIG. 10 illustrates potential applications for an active matrix display including a driver system in implementations according to the present disclosure.

FIG. 10 illustrates potential applications for an active matrix 1000 display including a driver system in implementations of the present disclosure.

In one implementation, the active matrix display 1000 is included in a vehicle 1020. The vehicle 1020 can be any type of vehicle, such as a motorcycle, an automobile, a truck, or a work vehicle. The active matrix display 1000 can be incorporated in any feature within the vehicle, such as a dashboard, a rear-view camera, an entertainment console (such as a radio tuner or CD player), a global positioning system (GPS), or in-vehicle entertainment (such as a television for rear passengers). The active matrix display 1000 can also be incorporated into an augmented reality device, such as a smart windshield.

In another implementation, the active matrix display 1000 is included in a wearable device 1040. The wearable device 1040 can be any such wearable device, such as glasses, goggles, headphones, a wig, clothing, or a watch. In the case of goggles or glasses, the wearable device 1040 can provide an augmented reality or virtual reality experience using the active matrix display 1000.

In yet another implementation, the active matrix display 1000 is included in a portable electronic device 1060, such a mobile phone, a smartphone, a tablet computer, or a portable game system. These devices generally include at least one primary screen that covers most of a face of the portable electronic device. The primary screen can be implemented with active matrix display 1000.

In some implementations, the portable electronic device 1060 includes no primary screen, such as some Moving Picture Experts Group (MPEG) Audio Layer III (MP3) players. Such a portable electronic device 1060 can still include an active matrix display 1000, possibly even as a screen. In addition, some portable electronic devices can include a secondary screen to supplement the primary screen, such as in a clamshell or on a side face or rear face of the device. These secondary screens also can be implemented with an active matrix display 1000.

In an additional implementation, the active matrix display 1000 is included in a laptop computer 1070. The laptop computer 1070 can be a notebook, a subnotebook, an ultraportable, a netbook, an ultrabook, a hybrid, a convertible, or a 2-in-1 laptop, In still other implementations, the active matrix display 1000 can be implemented within a television 1080. One example of such a television 1080 is a flat panel display.

Other implementations are possible, as well. For example, active matrix display 1000 can be incorporated within an illuminated billboard or traffic signal.

A micro LED is an LED device with a maximum width of 1 μm-100 μm. A micro LED display can have relatively few LED devices, such as when the display is a 2×3 matrix of LED devices. A micro LED display can also have significantly more devices, such as between 2000 and 1,000,000 micro LED pixels. In many instances, the micro LED pixels are individually addressable.

In some implementations, the driver systems 400, 500A, 500B, 600, 700A, 700B, 800, and 900 can be implemented in a light source array 150. The light source array 150 can be an adaptive light source in a system with a neuromorphic vision unit.

Figure 11:
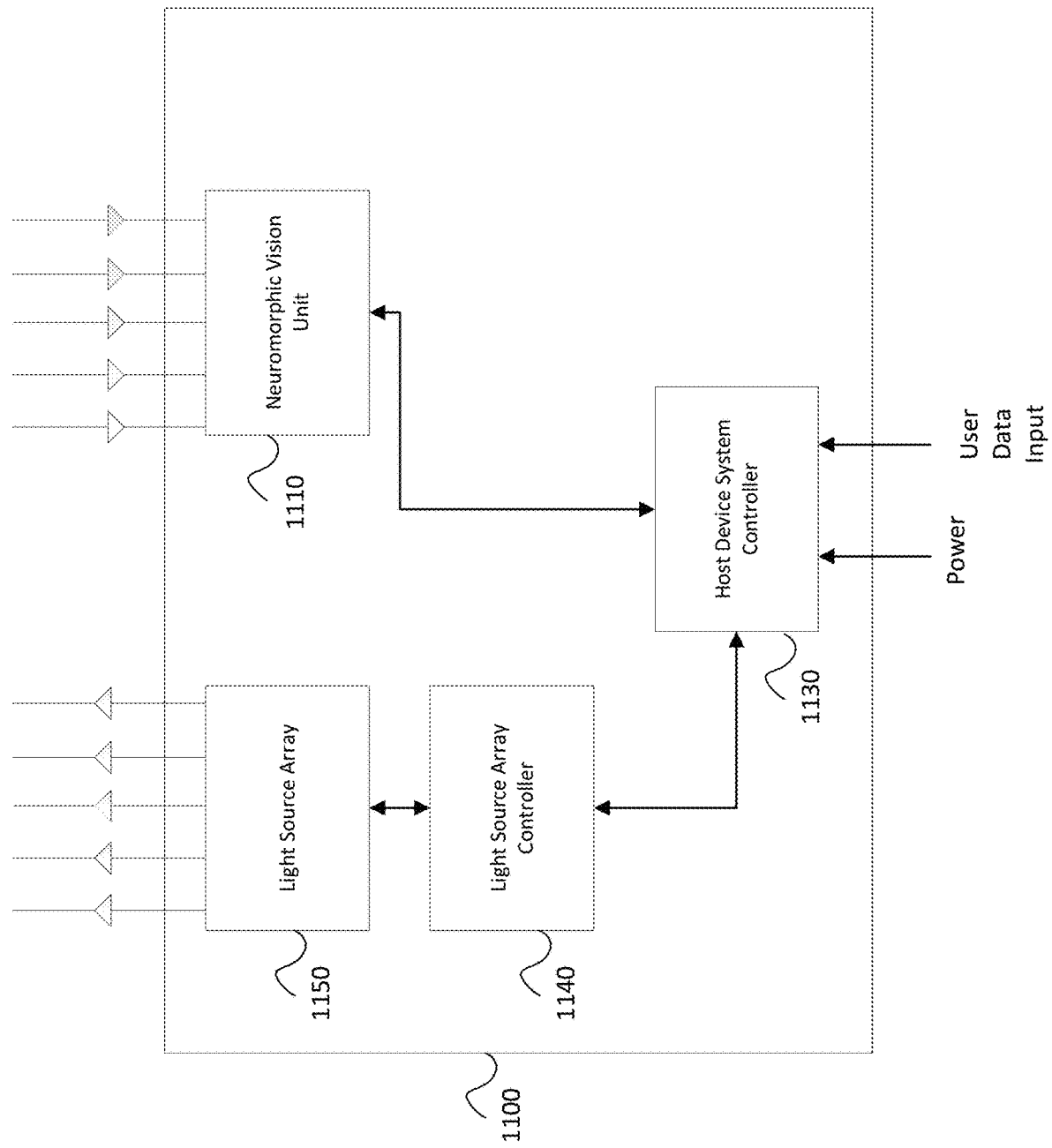
FIG. 11 illustrates a system with a neuromorphic vision unit and adaptive light source array in an implementation of the present disclosure.

FIG. 11 illustrates a system 1100 with a neuromorphic vision unit 1110 and adaptive light source array 1150 in an implementation of the present disclosure. The system 1100 includes the neuromorphic vision unit 1110, a host device system controller 1130, a light source array controller 1140, and light source array 1150.

The neuromorphic vision unit 1110 includes neuromorphic pixels that receive light reflected or produced by one or more objects in a scene. The neuromorphic pixels produce data, using the photoelectric effect, based on the light received from the one or more objects in the scene. Thus, the neuromorphic vision unit 1110 collects data from the scene.

In the implementation illustrated in FIG. 11, one or more neuromorphic algorithms can be run on the neuromorphic vision unit 1110. The neuromorphic vision unit 1110 can use the neuromorphic algorithms to perform a determination of attributes of the one or more objects in the scene. The attributes can include positions, first-order attributes like velocities and previous positions, second-order attributes like accelerations and previous velocities, and/or brightnesses of the one or more objects in the scene.

Thus, the neuromorphic vision unit 1110 can determine a plurality of regions in the scene, based on the one or more objects. Each of the plurality of regions can include one or more of the objects.

The neuromorphic vision unit 1110 performs this determination based at least in part on the data produced. In one implementation, the neuromorphic vision unit 1110 performs this determination based on supplemental position data.

For example, in some implementations, the system 1100 can include one or more additional sensors (not pictured), such as radar, lidar, or a camera, that can produce the supplemental position data. For example, the supplemental data can be or include, for example, position data produced by the one or more additional sensors.

The neuromorphic vision unit 1110 can determine an exposure time of pixels of the neuromorphic vision unit 1110. The neuromorphic vision unit 1110 can determine the exposure time of the pixels at least partly based on the regions in the scene and the attributes of the one or more objects.

In some implementations, the neuromorphic vision unit 1110 additionally or alternatively can decide an exposure setting of pixels of the neuromorphic vision unit 1110 or pixels of a camera, at least partly based on the regions in the scene and the attributes of the object. In this disclosure, the term "exposure setting" refers to both an exposure time and sensitivity settings.

In addition, the neuromorphic vision unit 1110 can determine current and/or pulse-width settings (e.g., of a single pulse or a duty cycle of a cycle of pulses) of segments or pixels of the light source array 1150. In one implementation, the neuromorphic vision unit 1110 can determine these current and/or PWM settings, based on a computation performed on the neuromorphic vision unit 1110 or on the host device system controller 1130. This choice can be made based on, for example, an application type.

Thus, the neuromorphic vision unit 1110 can determine light source and pixel configurations, based on the positions and/or velocities determined by the neuromorphic algorithm.

The host device system controller 1130 can receive the light source and pixel configurations produced by the neuromorphic vision unit 1110.

The host device system controller 1130 can transmit the light source and neuromorphic and sensor pixel configurations to the light source array controller 1140 for controlling the light source array 1150. Thus, the host device system controller 1130 can be a relatively simple processor.

In other implementations, the host device system controller 1130 itself can convert the light source and pixel configurations into settings for controlling the light source array 1150. Alternatively, the host device system controller 1130 can obtain raw data from the neuromorphic vision unit 1110 and produce the light source and neuromorphic pixel configurations itself. In implementations including a sensor system, like a camera, the host device system controller 1130 can produce settings for the camera based on the raw data. Thus, the host device system controller 1130 can be a more complex device that can itself execute a portion (or the entirety) of algorithm.

The light source array controller 1140 receives the transmitted configuration or produced settings from the host device system controller 1130. The light source array controller 1140 can determine or otherwise produce signals for adjusting pixels or segments of the light source array 1150. In some implementations, these signals are analog currents. In other implementations, these signals are digital signals, such as pulses or pulse-width modulated signals. In other implementations, these signals are hybrid, i.e., are analog currents with modulated pulse-widths.

The light source array 1150 receives the signals output by the light source array controller 1140. The light source array 1150 includes an array of light sources, such as LEDs or vertical-cavity surface-emitting lasers (VCSELs), as pixels. The light sources can produce light in the infrared, visible, and/or ultraviolet spectrum.

In most implementations, the array of light sources is a matrix or one-dimensional vector. Thus, the array is generally arranged in a square or rectangular shape. The scope of the present disclosure includes other implementations, such as disc or diamond shapes.

The light source array 1150 can be an adaptive LED display. The light source array 1150 includes several segments of one or more light sources in a matrix or vector. Each of the segments can be controlled individually by the light source array controller 1140. For example, each of the segments can have its own settings (e.g., current, PWM) to illuminate the scene.

The system 1100 can also include optics for directional illumination of the scene by the light source array 1150. In some implementations, a display is projected with a projection lens. The system 1100 can take pictures of the display with the light source as a direct view.

As with conventional LED arrays, the light source array controller 1140 can drive all of the segments of the light source array 1150 with a same signal. For example, the light source array controller 1140 can turn off all of the segments simultaneously. The light source array controller 1140 can also turn on all of the segments, such that all of the light sources emit light simultaneously.

In addition, the light source array controller 1140 can control a single segment. Similarly, the light source array controller 140 can control multiple segments simultaneously and independently.

Generally, all of the light sources of light source array 1150 are included in at least one segment, although implementations are possible in which one or more of the light sources are not controlled as part of a segment.

In addition, the light sources of the light source array 1150 can be included in multiple segments. For example, in an implementation in which the light source array 1150 is a rectangular matrix, a light source can be part of a row segment, as well as of a column segment.

The segments of the light source array 1150 can be matrices or vectors. For example, a light source array in a 4×4 matrix can include four 2×2 segments.

Thus, the light source array controller 1140 can control the light source array 1150 in its entirety, as individual or plural segments simultaneously, and in different shapes (e.g., vectors or sub-matrices). Accordingly, the light source array 1150 can be controlled by the light source array controller 1140 at a plurality of granularities.

Specifically, the light source array controller 1140 can illuminate a first segment of the light source array 1150 differently than a second segment of the light source array 1150. For example, the first segment can illuminate a first region of the scene dimly, while the second segment can dim illuminate a second region of the scene brightly.

When this illumination difference is instructed by the neuromorphic vision unit 1110 and not from a more complicated processing or from a more powerful processor, the differential illumination can be achieved with lower processor power consumption and/or lower latency. In addition, a position sensor of a conventional adaptive LED system can be enhanced by the neuromorphic vision unit 1110 detecting velocities, accelerations, and brightness.

Thus, some implementations of the system 1100 combine a programmable neuromorphic vision unit 1110 and the light source array 1150 in a self-adaptive concept. The neuromorphic vision unit 1110 can tune the exposure time and sensitivity of a region of pixels of a programmable sensor (e.g., the neuromorphic vision unit 1110 or camera) and the configurations of light sources within the light source array 1150.

Depending on the application, the neuromorphic vision unit 1110 can co-tune the current or PWM values of each segment of the light source array 1150 and exposure time of a pixel (at single pixel or region granularity of a sensor) in the spatial domain. To give an example, a part of the scene to be illuminated by a segment of the light source array 1150 and a region of a sensor that senses that part can have a local setting (e.g., pixel exposure or sensitivity, LED current/ PWM) that is different from segments and regions for other parts of the scene. For example, in a particular implementation, pixel exposure times are adjustable per region/pixel of the neuromorphic vision unit 1110. Local tuning of the exposure time and other settings for various (e.g., neuromorphic, light source, camera sensor) pixels corresponding to each region of the scene results in a set of local optimum settings. A dynamic scene in which a first object moves at a different speed than a speed of a second object can benefit from the local sensor and light source setting.

In addition, a first sensor region, sensor region 1, of neuromorphic vision unit 1110 can sense a first moving object on a dark background. The light source array controller 1140 can be instructed to control a corresponding first region, LED segment 1, of the light source array 1150, based on the neuromorphic vision unit 1110 sensing the first moving object. As a result, light source array controller 1140 can output a minimum pulse width, PWM duty cycle, or LED current to LED segment 1 that lights the first moving object sufficiently.

Thus, as the system provides sufficient LED peak illuminance, the neuromorphic vision unit 1110 can reduce an exposure setting (e.g., exposure time or sensitivity) of sensor region 1 locally to a value that minimizes a motion blur of the first moving object. In implementations including a camera, the neuromorphic vision unit 1110 likewise can set an exposure time of a corresponding first region of the camera to a value that minimizes a motion blur of the first moving object.

A second region, sensor region 2, of the neuromorphic vision unit 1110 can sense a second moving object traveling at a different speed in the foreground of the scene. Thus, the light source array controller 1140 can control a PWM duty cycle (or LED current) of LED segment 2 independently of the PWM duty cycle (or LED current) of LED segment 1. Thus, the illumination of the second moving object can be optimized, independent of the illumination of the first moving object.

Further, the neuromorphic vision unit 1110 can set an exposure setting of sensor region 2 independently of the exposure setting of sensor region 1. Thus, sensor region 2 of the neuromorphic vision unit 1110 can be optimized to reduce or eliminate motion blur for the second moving object. In implementations including a camera, the neuromorphic vision unit 1110 likewise can set an exposure setting (e.g., exposure time) of a corresponding second region of the camera to a value that does not lead to a motion blur of the second moving object.

Thus, the neuromorphic vision unit 1110 can balance scene illumination to overcome under-exposure and/or over-exposure problems by instructing the light source array controller 1140 and can overcome motion blur by controlling the regions of neuromorphic vision unit 1110 (and a camera).

Similarly, the neuromorphic vision unit 1110 can shorten the integration time of the darkest part of the scene when the light source array 1150 illuminates that part of the scene. Thus, the adaptive lighting of the light source array 1150 can illuminate low-light (or otherwise dark) areas of the scene, especially for objects that are far from the sensor. In some implementations, this illumination can be provided in combination with another software application running on the neuromorphic vision unit 1110. Thus, the application breadth and distance range of the system 100 can be enhanced.

Figure 12:
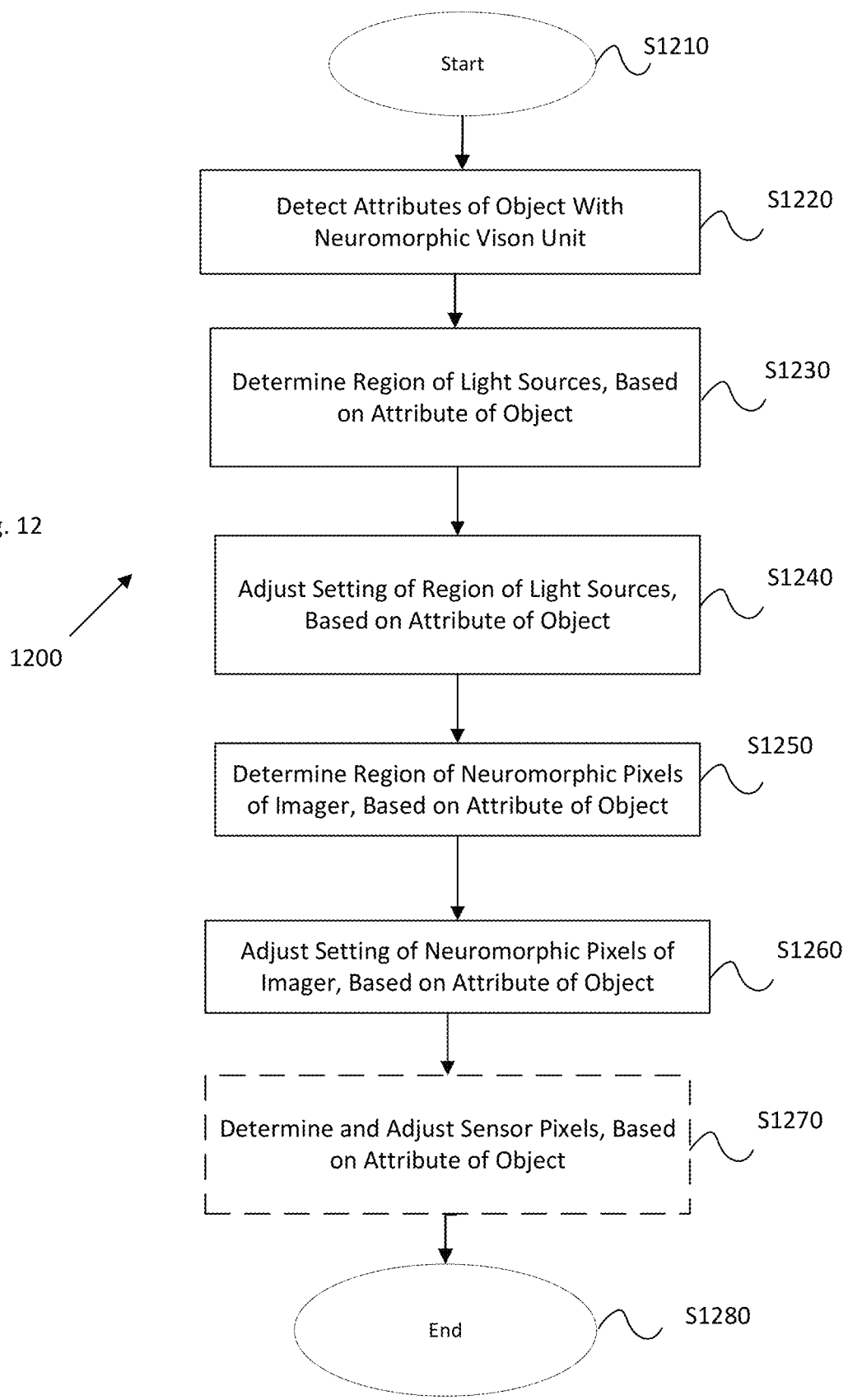
FIG. 12 illustrates an algorithm for an overall flow in an implementation of the present disclosure.

FIG. 12 illustrates an algorithm 1200 for an overall flow in an implementation of the present disclosure.

The algorithm begins at S1210 and proceeds to S1220.

At S1220, pixels of an imager of the neuromorphic vision unit 1110 photoelectrically capture light received from an object in a scene. In particular, a computation module of the neuromorphic vision unit can determine a region of coordinates of the object in the scene based on light received by the imager from the object. The computation module can determine the region of the object, at least in part based on a region of the pixels within the imager that receive the light. In many implementations, the region of coordinates of the object in the scene includes two-dimensional coordinates (e.g., (X, Y)) with reference to a horizontal and vertical axis. In some implementations, the region of coordinates can also include a third coordinate with reference to a depth axis (e.g., Z in the triplet (X, Y, Z)). The coordinates can take any reference as the origin.

In some implementations, the neuromorphic vision unit 1110 can receive position data from a radar or lidar sensor. Thus, the neuromorphic vision unit 1110 can determine the region of coordinates of the object in the scene additionally based on the position data. In many such implementations, a third coordinate, corresponding to the depth axis, can be based on this position data.

In addition, the neuromorphic vision unit 1110 can produce or receive a timestamp of the time at which the pixels of the imager captured the light from the object.

Based on a change over time in the region of coordinates of the same or similar amount of light and/or based on a change in the amount of light received at the same region of coordinates, the computation module can detect the movement of the object in the scene.

Figure 13A:
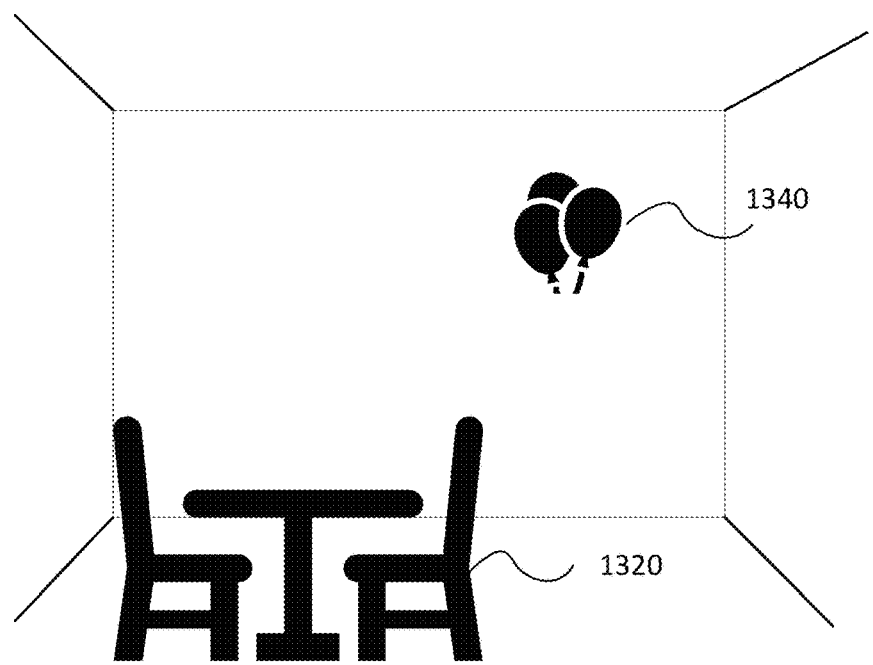
FIG. 13A illustrates an example of a scene to be illuminated by an implementation of the present disclosure

For example, the scene might be as illustrated as in FIG. 13A. Specifically, FIG. 13A illustrates an example of a scene to be illuminated by an implementation of the present disclosure. FIG. 13A includes a table and chairs 1320 and balloons 1340. The table and chairs 1320 are stationary and in the foreground of the scene, and the balloons 1340 are moving and in the background of the scene.

Figure 13B:
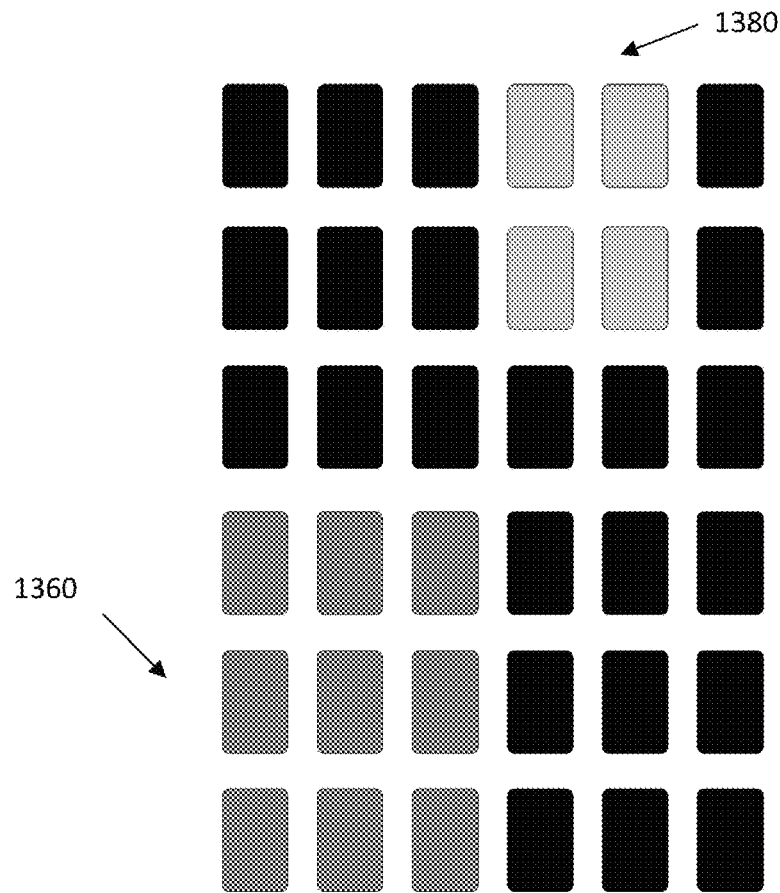
FIG. 13B illustrates an example of a light source intensity profile for the scene illustrated in FIG. 13A.

The table and chairs 1320 and the balloons 1340 reflect ambient light toward the pixels of imager. Thus, in an example of S1220 of FIG. 12, the pixels of the imager capture this light at time T1. Based on the light captured by the imager from table and chairs 1320, the computation module determines the table and chairs 1320 are in a region bounded by (0,0), (0, 2), (2, 2), and (2, 0), as illustrated in FIG. 13B. Similarly, the computation module can determine balloons 1340 are in a first region bounded by (3, 4), (3, 5), (4, 5), and (4, 4), based on the light captured by the pixels of the imager from the balloons 1340. The computation module can timestamp these regions with time $T_1$.

Later, the pixels of the imager capture the reflected ambient light from table and chairs 1320 and balloons 1340 at time T2. The computation module again determines the table and chairs 1320 are in the region bounded by (0,0), (0, 2), (2, 2), and (2, 0). Meanwhile, the balloons 1340 have sunk. Thus, the computation module now determines the balloons 1340 are in a second region bounded by (3, 3), (3, 4), (4, 4), and (4, 3), based on the light captured by the pixels of the imager from the balloons 1340. The computation module can timestamp these regions with time $T_2$.

The computation module compares the region for the table and chairs 1320 at time T1 and the region for the table and chairs 1320 at time T2. Similarly, the brightness of the table and chairs 1320 did not change between time T1 and time T2. Thus, the computation module does not determine a change in attributes of the table and chairs 1320.

The computation module compares the first region for the balloons 1340 at time T1 and the second region for the balloons 1340 at time T2. Regardless of a change in brightness of the balloons 1340, the neuromorphic vision unit determines a movement of the balloons 1340. The neuromorphic vision unit 1110 can determine one or more updated attributes of the balloons 1340. These attributes can include a position of the balloons 1340, a velocity (including direction and the magnitude of velocity) of the balloons 1340, an acceleration (including direction and the magnitude of acceleration) of the balloons 1340, and, as relevant, a change in brightness of balloons 1340.

The computation module can determine the velocity of the balloons 1340 by dividing a positional difference between the first region for the balloons 1340 and the second region for the balloons 1340, by the difference between the timestamp $T_1$ and the timestamp $T_2$. The positional difference preferably, but not necessarily, corresponds to the real-world positional difference, not just a positional difference between pixels of the neuromorphic vision unit 1110. Thus, the computation module can supplement this positional difference with additional positional data from a sensor (e.g., a radar or lidar sensor or camera) that detects the balloons 1340. The computation module can then calculate the positional difference of the balloons 1340 at least in part based on the data received from the sensor.

In some implementations, the additional positional data from the sensor includes a timestamp at which the sensor sensed the data. The computation module can calculate a velocity of the balloons 1340 at least in part based on the timestamp from the sensor.

The computation module also can determine the acceleration of the balloons 1340 by dividing the difference between the velocity of the balloons 1340 at time T1 and the velocity of the balloons 1340 at time T2 by the difference between the timestamp T1 and the timestamp T2.

Again, the computation module can supplement the acceleration calculation at least in part based on additional positional data from the sensor. A person having ordinary skill in the art would understand how to perform this further calculation based on the teachings of this disclosure.

In some implementations, the computation module can transmit data indicating the attributes within the system 1100, e.g., to host device system controller 1130. The algorithm then proceeds to S1230.

At S1230, the neuromorphic vision unit 1110 determines one or more regions of pixels within the light source array 1150, at least in part based on the attributes detected at S1220.

In particular, the one or more regions are at least in part based on the position of the objects in the scene. For example, if the pixels of light source array 1150 are mapped one-to-one to the pixels of the imager, then the computation module determines a first region bounded by (0, 0), (0, 2), (2, 2), and (2, 0) and a second region bounded by (3, 4), (3, 5), (4, 5), and (4, 4).

The computation module can determine an additional portion of the region of pixels of the light source array 1150, at least in part based on a direction of velocity of the object. For example, the computation module can determine the balloons 1340 are sinking. In that situation, the computation module can determine the region of pixels also includes (3, 3) and (4, 3), and (3, 5) and (4, 5). Thus, the computation module can anticipate a continuation of the object's movement.

Further, based on a determination that the balloons 1340 are sinking at a speed above a threshold, the computation module can determine the region includes an additional row, e.g., (3, 2) and (4, 2). The threshold can be predetermined or determined dynamically based on attributes (e.g., the acceleration or the size) of the object and the scene.

In addition, the computation module can determine an additional portion of the region of pixels of light source array 1150 at least in part based on the acceleration of the object. For example, in a non-pictured example, based on a determination that the balloons have a downward velocity and are accelerating downward, the computation module can determine the region includes an additional row, e.g., (3, 2) and (4, 2), in addition to (3, 3) and (4, 3) for the velocity. Based on a determination that the balloons 1340 have an upward velocity and are accelerating downward (e.g., were bumped upward and are being pulled downward by gravity), the computation module can determine the region includes fewer rows (e.g., only (3, 6) and (4, 6) instead of also (3, 7) and (4, 7)).

The use of the identical regions of coordinates of the imager for the regions of coordinates of the light source array 1150 in FIG. 13B is for purposes of illustration, not limitation. In many implementations, the light source array 1150 and the imager have different sizes and/or resolutions. Therefore, the regions of the light source array 1150 and the imager can be different. Thus, the light source array 1150 and the imager can use different coordinate systems, and the computation module can achieve compatibility by converting between the different coordinate systems.

In addition, a pixel in the imager is generally offset from a corresponding pixel in the light source array 1150 relative to the object. Thus, an angular difference exists between the location of the pixel in the light source array 1150, relative to the object, and the location of the pixel within the imager, relative to the object. Additionally, because the surface of the object can be textured or curved, the light emitted by the pixel of the light source array 1150 and reflected by the object need not return to the corresponding pixel in the imager. Thus, the computation module can compensate. In some implementations, at least some of the light sources themselves can emit light at an angle.

For example, many implementations of system 1100 include optics, such as lenses, for directional illumination of a scene. The reason is that an array of classical broadly (i.e., Lambertian) emitting LEDs would not illuminate only subparts or regions of the scene.

If the computation module determines the object is approaching the camera (e.g., a change in the Z coordinate), the computation module can determine the region includes the pixels of the light source array 1150 surrounding (e.g., above, below, to the left of, and to the right of) the position of the object.

Similarly, if the computation module determines the object is receding from the camera, the computation module can determine the region includes the pixels of light source array 1150 on the periphery of the position of the object (e.g., just inside the current boundary of the light source pixels corresponding to the object). For example, if a user is holding system 1100 and takes a step backward from table and chairs 1320, then the computation module can determine the region includes (0, 0), (0, 1), (0, 2), (1, 0), (1, 2), (2, 0), (2, 1), and (2, 2).

The algorithm 1200 then advances to S1240.

At S1240, the computation module instructs the light source array controller 1140 to adjust a current and/or a modulation of the regions of the light source array 1150 determined in S1230. The current and/or modulation is based at least in part on the attributes of the objects (e.g., the table and chairs 1320 and/or the balloons 1340).

Thus, the computation module can improve the luminance provided to the object by the region of the light source array 1150 by increasing the current or, for example, by increasing a duty cycle driving the region of light source array 1150. The computation module also can decrease the luminance by decreasing the current or, for example, by decreasing the duty cycle driving the region of pixels of light source array 1150.

For example, FIG. 13B can also illustrate an example of a light source intensity profile for the scene illustrated in FIG. 13A. As can be seen, the region bounded by (3, 4), (3, 5), (4, 5), and (4, 4) includes lighter pixels to illustrate that the pixels of light source array 1150 corresponding to that region produce more illumination. Thus, the light source array 1150 can illuminate the balloons 1340 more brightly. A higher level of illumination is more appropriate for an object in the background or an object in motion.

The region bounded by (0, 0), (0, 2), (2, 2), and (2, 0) includes darker pixels to illustrate the pixels of light source array 1150 produce less illumination. Thus, the light source array 1150 can illuminate the table and chairs 1320 at a lower level. A lower level of illumination is more appropriate for an object in the foreground or an object in rest.

The pixels outside the two boxes include much darker pixels to illustrate that the background receives little or no additional illumination. This lack of illumination is appropriate for stationary background objects.

Thus, due to the adaptive illumination, the neuromorphic vision unit 1110 can better sense the table and chairs 1320 and the balloons 1340 in the scene. In implementations including a camera, the camera can better capture a picture of the scene.

In addition or alternatively, the computation module can adjust a brightness provided by the region of pixels of light source array 1150, at least in part based on first-order attributes, like the velocity of the object. For example, based on a determination that the balloons 1340 are moving downward at a velocity below a threshold, the computation module can increase the illumination slightly. Further, based on a determination that the balloons 1340 are moving downward at a velocity above the threshold, the computation module can increase the illumination of the region of the light source array 1150 by a greater amount.

Similarly, the neuromorphic vision unit 1110 also can adjust an illumination provided by the region of pixels of light source array 1150, at least in part based on second-order attributes, like the acceleration of the object. For example, based on a determination that the balloons 1340 have an upward velocity and are accelerating downward, the computation module can increase the illumination of the pixels in the region of the light source array 1150 slightly. Based on a determination that the balloons 1340 have a downward velocity and are accelerating downward, the computation module can increase the brightness of the region of pixels in light source array 1150 by a greater amount.

The computation module can weight the illumination provided by the pixels of light source array 1150 at least in part based on a degree of certainty as to the relevance of the pixels of light source array 1150. For example, the computation module can illuminate the region with a gradient. In some implementations, the gradient can be at least in part based on the attributes of the object. For example, if the computation module determines a first portion of the region of the light source array 1150 based on the position of the object, then the computation module can more highly illuminate the light sources in the first portion of the region. If the computation module determines a second portion of the region based on the velocity of the object, then the computation module can more dimly illuminate the light sources in the second portion of the region (e.g., (3, 3) and (4, 3)). The computation module can make more sophisticated determinations based on other attributes, such as previous attributes and the acceleration of the object, particularly relative to the velocity of the object.

If the computation module determines the object is approaching the camera, the computation module can darken the pixels surrounding (e.g., above, below, to the left of, and to the right of) the region of the light source array 1150. Similarly, if the computation module determines the object is receding from the imager, the computation module can brighten the pixels in the region of the light source array 1150 (e.g., on the periphery of the position of the object).

The algorithm 1200 then proceeds to S1250. In S1250, the neuromorphic vision unit 1110 determines a region of neuromorphic pixels of the imager, based on attributes of the object. These attributes can include a position of the object, a first-order attribute (e.g., direction and/or magnitude of a velocity of the object, position history), and a second-order attribute (e.g., direction and/or magnitude of an acceleration of the object, velocity history).

The neuromorphic vision unit 1110 determines a region of neuromorphic pixels of the imager at least in part based on the neuromorphic pixels sensing the position of the object. The neuromorphic vision unit 1110 can determine an additional region of pixels of the imager, based on the first-order attributes and second-order attributes, in a similar respect to how the neuromorphic vision unit 110 determines the additional portions of the region of pixels of the light source array 11150 in S1230. For example, the additional region can include pixels in the direction of velocity of the object. Thus, further explanation is omitted to avoid obscuring the present advancement. The algorithm then proceeds to S1260.

In S1260, the computation module adjusts the region of neuromorphic pixels of the imager, based on the attributes of the object. For example, the computation module adjusts an exposure setting of the neuromorphic pixels of the region of the imager. If the computation module determines the object has a nonzero velocity or a positive acceleration, then the computation module can reduce the exposure time of the pixels of the region of the imager. If the computation module determines the object has a negative acceleration, then the computation module can increase the exposure time of the pixels of the region of the imager. The algorithm then advances to S1270.

In S1270, the computation module optionally determines and adjusts pixels of a sensor. An example of such a sensor is a camera, whether infrared, monochrome, or RGB (red, green, blue). The computation module can determine a region of the sensor pixels, based on the attributes of the object. For example, the computation module can determine that a pixel of the sensor photoelectrically captures light from the same object as the imager captures light.

The computation module can then determine an additional region of pixels of the sensor, based on the first-order attributes and second-order attributes, in a similar respect to how the computation module determines the additional portion of the region of pixels of the light source array 1150 in S1230.

The algorithm concludes in S1280.

Modifications

In an implementation illustrated in FIG. 1, the drivers 140 follow the array 130. In one possible modification, the drivers 140 are between the high rail and the transistors 120. In another possible modification, the drivers 140 are between the transistors 120 and the array 130.

FIG. 5B illustrated an example in which a single analog IC 520 can set a reference current for multiple digital driver ICs 550. Just as the teachings of FIG. 9 are applicable to the subject matter of FIGS. 4-8, the analog sources of the other figures can drive multiple digital drivers as in FIG. 5B.

FIG. 6 was drafted to suggest digital control of modulation. In some implementations, the switches of FIG. 6 are implemented with analog switches. In such a case, driver system 600 can be implemented with an analog IC, not mixed signal IC 650. These analog switches can be implemented in other figures, as well, such as FIG. 5.

FIG. 7 (and others) depict one IC for all pixels of a certain color. This depiction is for purposes of explanation only. In some implementations, there are multiple ICs for a certain color. Indeed, some such implementations advantageously permit the analog sources to be more accurately tuned for cross-substrate variation in transistor characteristics.

As used herein, the terms "storage media," "computer-readable storage media," or "computer-readable storage medium" can refer to non-transitory storage media, such as a hard drive, a memory chip, and cache memory, and to transitory storage media, such as carrier waves or propagating signals.

Aspects of the driver system can be embodied in various manners (e.g., as a method, a system, a computer program product, or one or more computer-readable storage media). Accordingly, aspects of the present disclosure can take the form of a hardware implementation, a software implementation (including firmware, resident software, or microcode) or an implementation combining software and hardware aspects that can generally be referred to herein as a "circuit," "module" or "system." Functions described in this disclosure can be implemented as an algorithm executed by one or more hardware processing units, e.g., one or more microprocessors of one or more computers. In various embodiments, different operations and portions of the operations of the methods described can be performed by different processing units. Furthermore, aspects of the present disclosure can take the form of a computer program product embodied in one or more computer readable media having computer readable program code embodied, e.g., encoded or stored, thereon. In various implementations, such a computer program can, for example, be downloaded (or updated) to existing devices and systems or be stored upon manufacturing of these devices and systems.

The detailed description presents various descriptions of specific implementations. The innovations described can be implemented in a multitude of different ways, for example, as defined and covered by the claims and/or select examples. In the description, reference is made to the drawings where like reference numerals can indicate identical or functionally similar elements. Elements illustrated in the drawings are not necessarily drawn to scale. Additionally, certain embodiments can include more elements than illustrated in a drawing and/or a subset of the elements illustrated in a drawing. Further, some embodiments can incorporate a suitable combination of features from two or more drawings.

The disclosure describes various illustrative implementations and examples for implementing the features and functionality of the present disclosure. While components, arrangements, and/or features are described in connection with various example implementations, these are merely examples to simplify the present disclosure and are not intended to be limiting. In the development of any actual implementation, numerous implementation-specific decisions can be made to achieve the developer's specific goals, including compliance with system, business, and/or legal constraints, which can vary from one implementation to another. Additionally, while such a development effort might be complex and time-consuming, it would be a routine undertaking for those of ordinary skill in the art having the benefit of this disclosure.

In the Specification, reference was made to the spatial relationships between various components and to the spatial orientation of various aspects of components as depicted in the attached drawings. The devices, components, members, and apparatuses described can be positioned in any orientation. Thus, the use of terms such as "above", "below", "upper", "lower", "top", "bottom", or other similar terms to describe a spatial relationship between various components or to describe the spatial orientation of aspects of such components, describes a relative relationship between the components or a spatial orientation of aspects of such components, respectively, as the components described can be oriented in any direction. When used to describe a range of dimensions or other characteristics (e.g., time, pressure, temperature, length, width, etc.) of an element, operations, and/or conditions, the phrase "between X and Y" represents a range that includes X and Y. The systems, methods and devices of this disclosure have several innovative aspects, no one of which is solely responsible for the attributes disclosed herein. Some objects or advantages might not be achieved by implementations described herein. Thus, for example, certain implementations can operate in a manner that achieves or optimizes one advantage or group of advantages as taught herein and not other objects or advantages as may be taught or suggested herein.

In one example implementation, any number of electrical circuits of the FIGS. can be implemented on a board of an associated electronic device. The board can be a general circuit board that can hold various components of the internal electronic system of the electronic device and, further, provide connectors for other peripherals. More specifically, the board can provide the electrical connections by which other components of the system can communicate electrically. Any processors (inclusive of digital signal processors, microprocessors, supporting chipsets, etc.) and computer-readable non-transitory memory elements can be coupled to the board based on configurations, processing demands, computer designs, etc. Other components such as external storage, additional sensors, controllers for audio/video display, and peripheral devices can be attached to the board as plug-in cards, via cables, or integrated into the board itself. In various implementations, the functionalities described herein can be implemented in emulation form as software or firmware running within one or more configurable (e.g., programmable) elements arranged in a structure that supports these functions. The software or firmware providing the emulation can be provided on one or more non-transitory, computer-readable storage media including instructions to allow one or more processors to carry out those functionalities.

In another example implementation, the electrical circuits of the FIGS. can be implemented as stand-alone modules (e.g., a device with associated components and circuitry configured to perform a specific application or function) or implemented as plug-in modules into application specific hardware of electronic devices. Implementations of the present disclosure can be readily included in a system-on-chip (SOC) package. An SOC represents an integrated circuit (IC) that integrates components of a computer or other electronic system into one chip. The SOC can contain digital, analog, mixed-signal, and often radio frequency functions that can be provided on one chip substrate. Other embodiments can include a multi-chip-module (MCM), with a plurality of separate ICs located within one electronic package and that interact through the electronic package. In various other implementations, the processors can be implemented in one or more silicon cores in Application Specific Integrated Circuits (ASICs), Field Programmable Gate Arrays (FPGAs), and other semiconductor chips.

The specifications, dimensions, and relationships outlined herein (e.g., the number of processors and logic operations) have been offered for non-limiting purposes of example and teaching. Such information can be varied considerably. For example, various modifications and changes can be made to arrangements of components. The description and drawings are, accordingly, to be regarded in an illustrative sense, not in a restrictive sense.

With the numerous examples provided herein, interaction was described in terms of two, three, four, or more electrical components for purposes of clarity and example. The system can be consolidated in any manner. Along similar design alternatives, the illustrated components, modules, and elements of the FIGS. can be combined in various possible configurations that are clearly within the scope of this disclosure. In certain cases, it might be easier to describe one or more of the functionalities of a given set of flows by referencing a limited number of electrical elements. The electrical circuits of the FIGS. and their teachings are readily scalable and can accommodate many components, as well as more complicated/sophisticated arrangements and configurations. Accordingly, the examples provided do not limit the scope or inhibit the teachings of the electrical circuits as potentially applied to a myriad of other architectures.

In this disclosure, references to various features (e.g., elements, structures, modules, components, steps, operations, characteristics, etc.) included in "one implementation", "example implementation", "an implementation", "another implementation", "some implementations", "various implementations", "other implementations", "alternative implementation", and the like are intended to mean that any such features are included in one or more implementations of the present disclosure and might or might not necessarily be combined in the same implementations.

Some of the operations of this disclosure can be deleted or omitted where appropriate, or these operations can be modified or changed considerably. In addition, the timing of these operations can be altered considerably. The preceding operational flows have been offered for purposes of example and discussion. Implementations described herein provide flexibility in that any suitable arrangements, chronologies, configurations, and timing mechanisms can be provided.

EXAMPLES

In Example 1, a driver system for controlling a plurality of light emitting diodes (LEDs) is provided. The driver system comprises a first driver configured to provide an LED current to each of the plurality of LEDs, the first driver including a current mirror for the LED current provided to the plurality of LEDs; and a second driver configured to modulate the LED current provided to the plurality of LEDs.

Example 2 is the driver system of Example 1, wherein the current mirror of the first driver comprises a plurality of transistors.

Example 3 is the driver system of any of Examples 1-2, wherein the plurality of transistors are thin-film transistors.

Example 4 is the driver system of any of Examples 1-3, wherein the first driver includes two transistors in a path of the LED current.

Example 5 is the driver system of any of Examples 1-4, wherein the first driver includes a first controller to set a reference current to be mirrored to the LED current.

Example 6 is the driver system of any of Examples 1-5, wherein the second driver includes a plurality of pulse-width modulation (PWM) drivers.

Example 7 is the driver system of any of Examples 1-6, wherein the second driver includes a second controller configured to modulate the LED current.

Example 8 is the driver system of any of Examples 1-7, wherein the first controller and the second controller are included in a hybrid analog and digital controller.

Example 9 is the driver system of any of Examples 1-8, wherein the plurality of LEDs are micro LEDs.

Example 10 is the driver system of any of Examples 1-9, wherein the plurality of LEDs includes a first LED and a second LED of a first color and a first LED and a second LED of a second color, a first pixel including the first LED of the first color and the first LED of the second color, a second pixel including the second LED of the first color and the second LED of the second color, the first and second LEDs of the first color are provided a first LED current, and the first and second LEDs of the second color are provided a second LED current.

Example 11 is a method implemented by a driver system, the method comprising: providing an LED current to each of a plurality of light emitting diodes (LEDs) with a first driver, the first driver including a current mirror for the LED current; and modulating, with a second driver, the LED current provided to the plurality of LEDs.

Example 12 is the method of Example 11, wherein the current mirror includes a plurality of transistors, and the plurality of transistors are thin-film transistors.

Example 13 is the method of any of Examples 11-12, wherein the first driver includes a first controller to set a reference current to be mirrored to the LED current.

Example 14 is the method of any of Examples 11-13, wherein the second driver includes a plurality of pulse-width modulation (PWM) drivers.

Example 15 is the method of any of Examples 11-14, wherein the second driver includes a second controller configured to modulate the LED current.

Example 16 is the method of any of Examples 11-15, wherein the first controller and the second controller are included in a hybrid analog and digital controller.

Example 17 is the method of any of Examples 11-16, wherein the plurality of LEDS are micro LEDs.

Example 18 is the method of any of Examples 11-17, wherein the plurality of LEDs includes a first LED and a second LED of a first color and a first LED and a second LED of a second color, a first pixel includes the first LED of the first color and the first LED of the second color, a second pixel includes the second LED of the first color and the second LED of the second color, the first and second LEDs of the first color are provided a first LED current, and the first and second LEDs of the second color are provided a second LED current.

Example 19 is a light-emitting diode (LED) matrix, comprising: a plurality of LEDs arranged in rows and columns; a first driver configured to provide an LED current to each of the plurality of LEDs, the first driver including a current mirror for the LED current provided to the plurality of LEDs; and a second driver configured to modulate the LED current provided to the plurality of LEDs.

The invention claimed is:

1. A driver system, comprising:
a mirror transistor coupled to a current source;
at least two driving transistors coupled in parallel and configured to mirror current in the mirror transistor;
a first light emitting diode (LED) and a first modulator coupled in series and configured to receive a first current from one of the at least two driving transistors, a first end of the first LED directly coupled to one of the at least two driving transistors, a second end of the first LED directly coupled to a first end of the first modulator, a second end of the first modulator coupled to a low rail; and
a second LED and a second modulator coupled in series and configured to receive a second current from another of the at least two driving transistors, a first end of the second LED directly coupled to the other of the at least two driving transistors, a second end of the second LED directly coupled to a first end of the second modulator, a second end of the second modulator coupled to the low rail, the first LED configured to emit light having a first color, the second LED configured to emit light having the first color.

2. The driver system of claim 1, wherein the mirror transistor and the at least two driving transistors are thin-film transistors.

3. The driver system of claim 1, further comprising a first controller to set a reference current to be mirrored to the mirror transistor.

4. The driver system of claim 1, wherein the first modulator is configured to modulate the first current via pulse-width modulation (PWM) and the second modulator is configured to modulate the second current via PWM.

5. The driver system of claim 1, wherein the first LED and the second LED are micro LEDs.

6. The driver system of claim 1, wherein the current source is a discrete circuit component.

7. The driver system of claim 1, wherein the current source is disposed in an analog integrated circuit (IC) and the first modulator and the second modulator are disposed in a digital driver IC to form a hybrid driving arrangement.

8. The driver system of claim 1, wherein the current source and the first modulator and the second modulator are disposed in a mixed signal integrated circuit (IC).

9. The driver system of claim 1, wherein the current source is programmable.

10. The driver system of claim 1, wherein the at least two driving transistors are disposed in a transistor backplane.

11. The driver system of claim 1, wherein a first end of the mirror transistor is coupled to the current source and a second end of the mirror transistor is coupled to a high rail.

12. The driver system of claim 1, wherein a first end of the mirror transistor is coupled to the current source, a second end of the mirror transistor is coupled to a first end of another mirror transistor, and a second end of the other mirror transistor is coupled to a high rail.

13. A method implemented by a driver system, the method comprising:
receiving, with a mirror transistor, current from a current source;
receiving, with at least two driving transistors coupled in parallel, current from the mirror transistor;
receiving, with a first light emitting diode (LED) and a first modulator coupled in series, a first current from one of the at least two driving transistors, a first end of the first LED directly coupled to one of the at least two driving transistors, a second end of the first LED directly coupled to a first end of the first modulator, a second end of the first modulator coupled to a low rail; and
receiving, with a second LED and a second modulator coupled in series,
a second current from another of the at least two driving transistors, a first end of the second LED directly coupled to the other of the at least two driving transistors, a second end of the second LED directly coupled to a first end of the second modulator, a second end of the second modulator coupled to the low rail, the first LED configured to emit light having a first color, the second LED configured to emit light having the first color.

14. The method of claim 13, wherein the mirror transistor and at least the two driving transistors are thin-film transistors.

15. The method of claim 13, wherein the driver system includes a first controller to set a reference current to be mirrored to the mirror transistor.

16. The method of claim 13, wherein the first modulator is configured to modulate the first current via pulse-width modulation (PWM) and the second modulator is configured to modulate the second current via PWM.

17. The method of claim 13, wherein the first LED and the second LED are micro LEDs.

18. A light-emitting diode (LED) matrix, comprising:
a plurality of LEDs arranged in rows and columns, the plurality of LEDs including a first LED configured to emit light having a first color,
a second LED configured to emit light having the first color, and a third LED configured to emit light having a second color different from the first color; a mirror transistor coupled to a current source;
two driving transistors coupled in parallel and configured to receive current from the mirror transistor;
a first modulator coupled in series with the first LED and configured to receive a first current from one of the two driving transistors, a first end of the first LED directly coupled to one of the two driving transistors, a second end of the first LED directly coupled to a first end of the first modulator, a second end of the first modulator coupled to a low rail; and
a second modulator coupled in series with the second LED and configured to receive a second current from the other of the two driving transistors, a first end of the second LED directly coupled to the other of the two driving transistors, a second end of the second LED directly coupled to a first end of the second modulator, a second end of the second modulator coupled to the low rail.

* * * * *

UNITED STATES PATENT AND TRADEMARK OFFICE
CERTIFICATE OF CORRECTION

PATENT NO. : 11,900,859 B2
APPLICATION NO. : 17/326531
DATED : February 13, 2024
INVENTOR(S) : Van Lier et al.

It is certified that error appears in the above-identified patent and that said Letters Patent is hereby corrected as shown below:

In the Claims

In Column 26, Line 44, in Claim 13, delete "eoupled" and insert --coupled-- therefor In Column 26, Line 52, in Claim 13, after "series,", delete a linebreak Signed and Sealed this
Sixteenth Day of April, 2024

Katherine Kelly Vidal
*Director of the United States Patent and Trademark Office*